(12) United States Patent
Matsushita et al.

(10) Patent No.: US 11,037,948 B2
(45) Date of Patent: Jun. 15, 2021

(54) SEMICONDUCTOR STORAGE DEVICE AND METHOD FOR MANUFACTURING SEMICONDUCTOR STORAGE DEVICE

(71) Applicant: TOSHIBA MEMORY CORPORATION, Minato-ku (JP)

(72) Inventors: Sonoe Matsushita, Mie (JP); Takahito Nishimura, Kuwana (JP); Kazuyuki Yoshimochi, Kuwana (JP); Yoshihiro Yanai, Yokkaichi (JP); Satoshi Usui, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 84 days.

(21) Appl. No.: 16/561,521

(22) Filed: Sep. 5, 2019

(65) Prior Publication Data

US 2020/0295022 A1    Sep. 17, 2020

(30) Foreign Application Priority Data

Mar. 12, 2019   (JP) .............................. JP2019-044919

(51) Int. Cl.
*H01L 27/11565* (2017.01)
*H01L 27/11582* (2017.01)
*H01L 23/522* (2006.01)
*H01L 21/311* (2006.01)

(52) U.S. Cl.
CPC .. *H01L 27/11565* (2013.01); *H01L 21/31144* (2013.01); *H01L 23/5226* (2013.01); *H01L 27/11582* (2013.01)

(58) Field of Classification Search
None
See application file for complete search history.

(56) References Cited

U.S. PATENT DOCUMENTS

| 9,887,093 | B1 | 2/2018 | Omura | |
| 2010/0013049 | A1* | 1/2010 | Tanaka | H01L 27/11575 257/532 |
| 2014/0197546 | A1* | 7/2014 | Hwang | H01L 27/11548 257/774 |
| 2017/0207220 | A1* | 7/2017 | Yun | H01L 27/11578 |
| 2017/0263445 | A1 | 9/2017 | Soda | |
| 2018/0166380 | A1* | 6/2018 | Park | H01L 27/11575 |
| 2018/0247955 | A1* | 8/2018 | Iida | H01L 27/11565 |

(Continued)

FOREIGN PATENT DOCUMENTS

| JP | 2010-27870 A | 2/2010 |
| JP | 2013-201168 A | 10/2013 |
| JP | 2018-50000 A | 3/2018 |

*Primary Examiner* — Evren Seven
(74) *Attorney, Agent, or Firm* — Oblon, McClelland, Maier & Neustadt, L.L.P.

(57) ABSTRACT

A semiconductor storage device according to one embodiment is the semiconductor storage device that includes: a cell array region having a plurality of memory cells; and an outer edge portion arranged at an end portion to surround the cell array region. A stacked body in which a plurality of conductive layers are stacked via a first insulating layer and which has a stair portion in which end portions of the plurality of conductive layers form a stair shape is provided inside the cell array region, the stair portion facing the outer edge portion. A center of at least one step of the stair portion has a recess directed to an inner side of the cell array region.

10 Claims, 24 Drawing Sheets

(56) References Cited

U.S. PATENT DOCUMENTS

2019/0296038 A1\* 9/2019 Noda ................ H01L 27/11573
2020/0006378 A1\* 1/2020 Huo ..................... H01L 23/528
2020/0051996 A1\* 2/2020 Lee ................... H01L 27/11582

\* cited by examiner

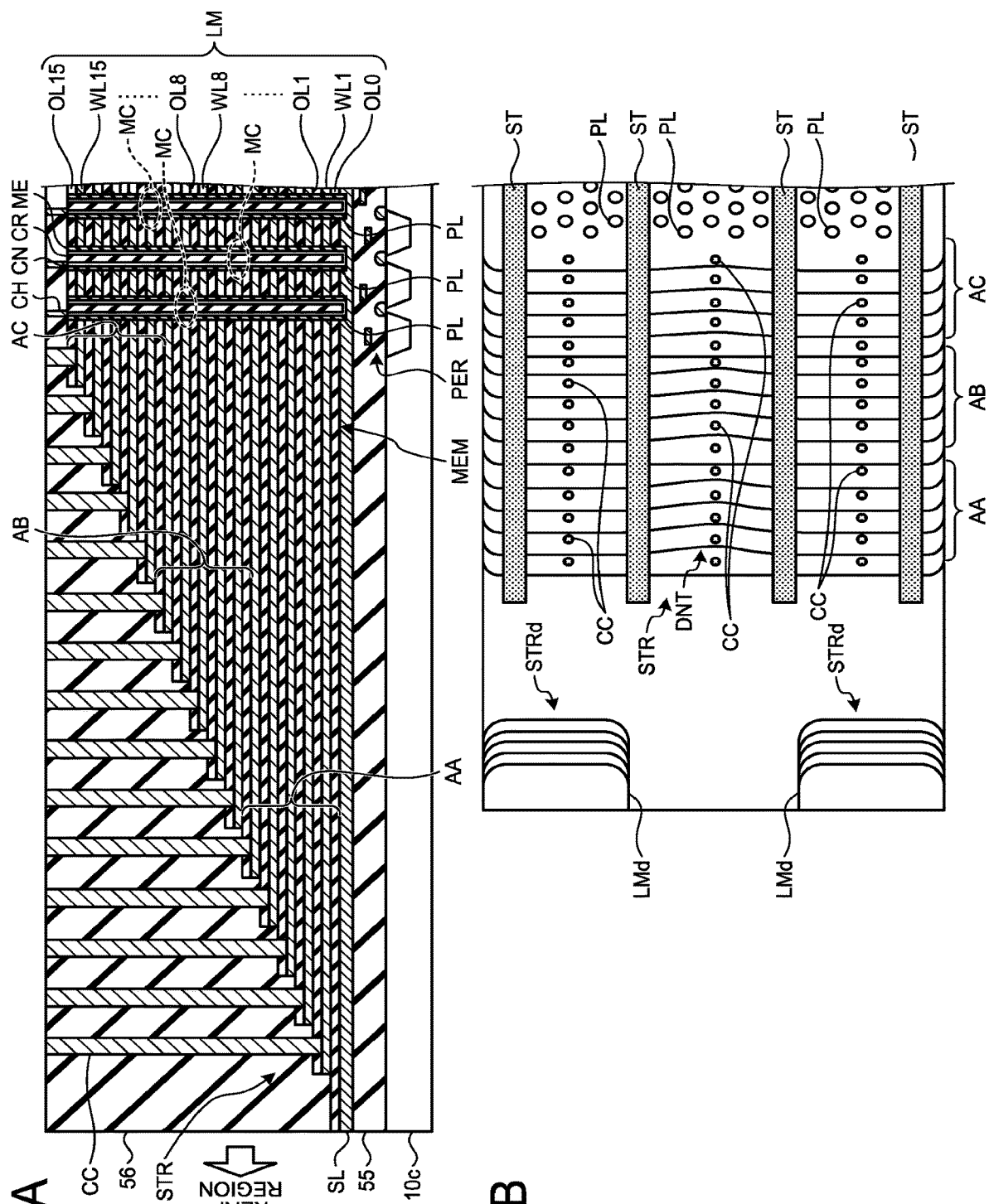

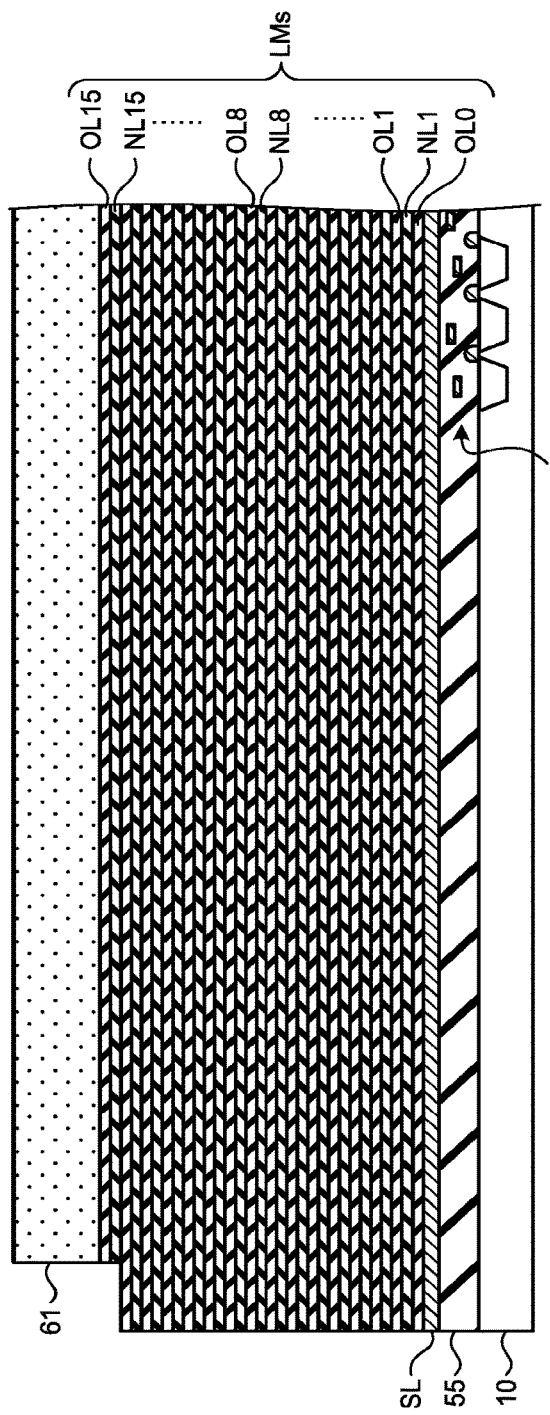
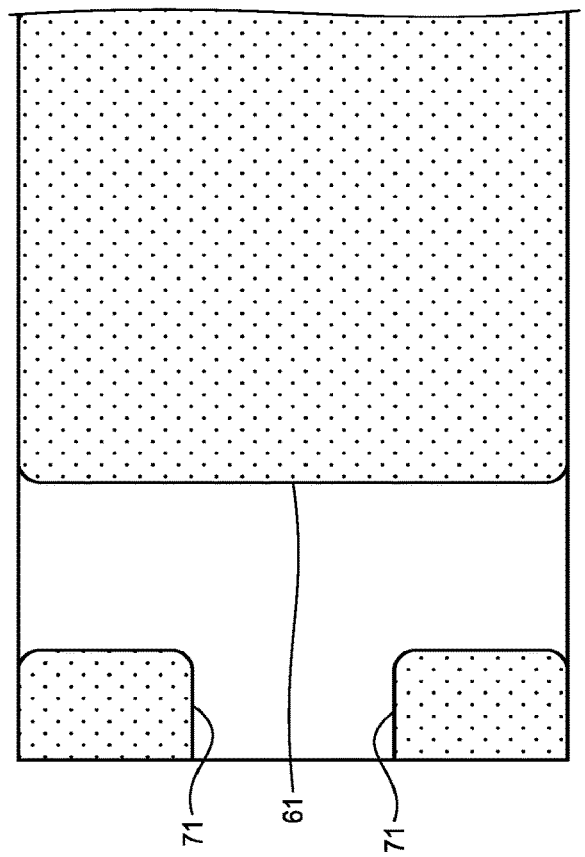
FIG.5A
FIG.5B

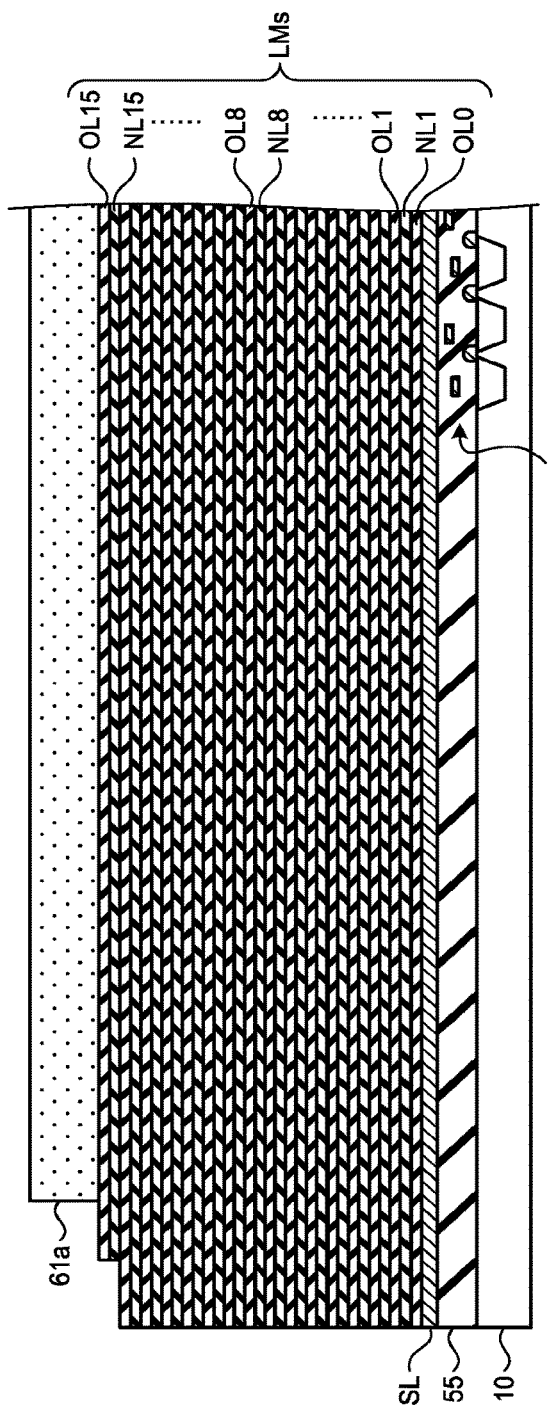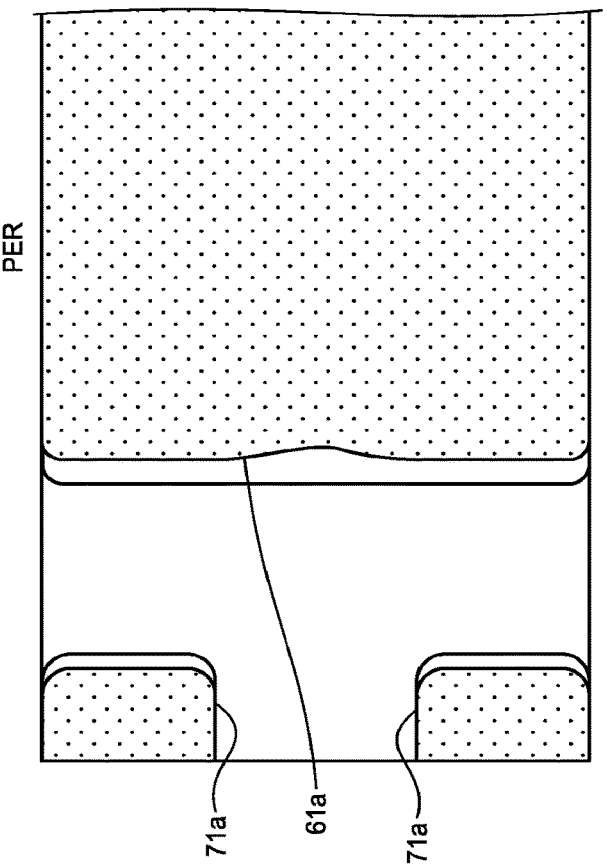
FIG.6A
FIG.6B

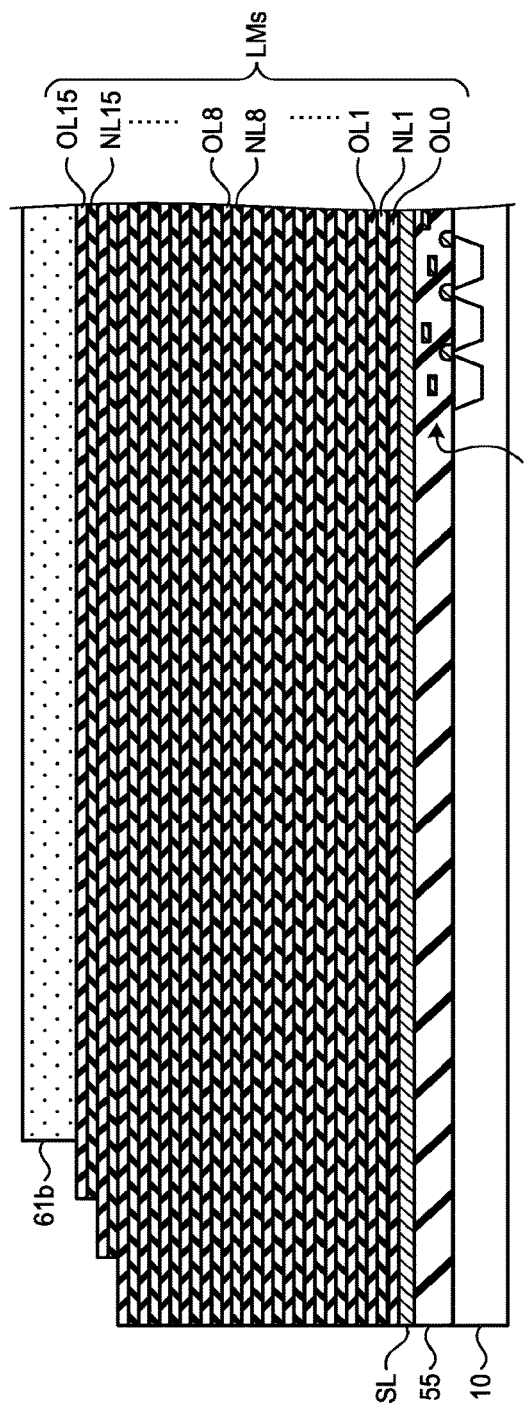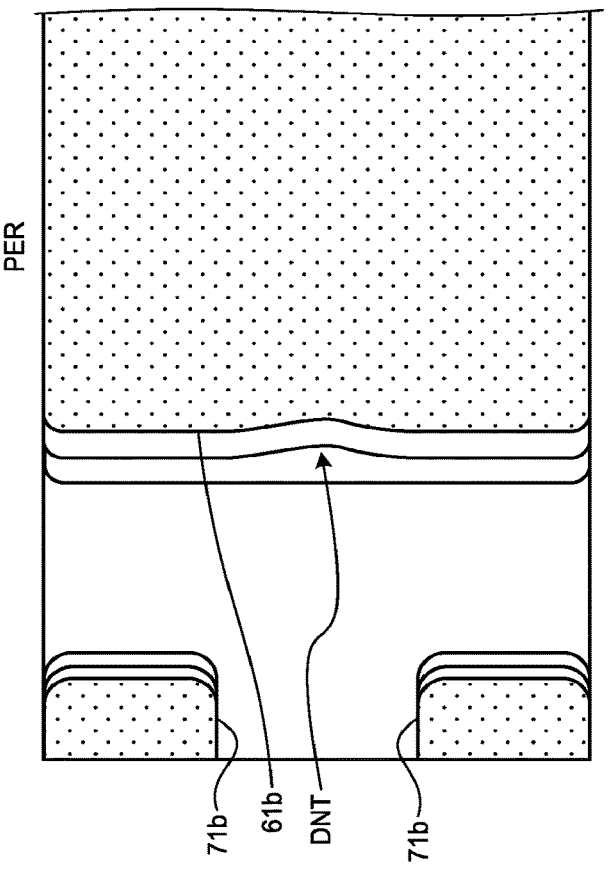

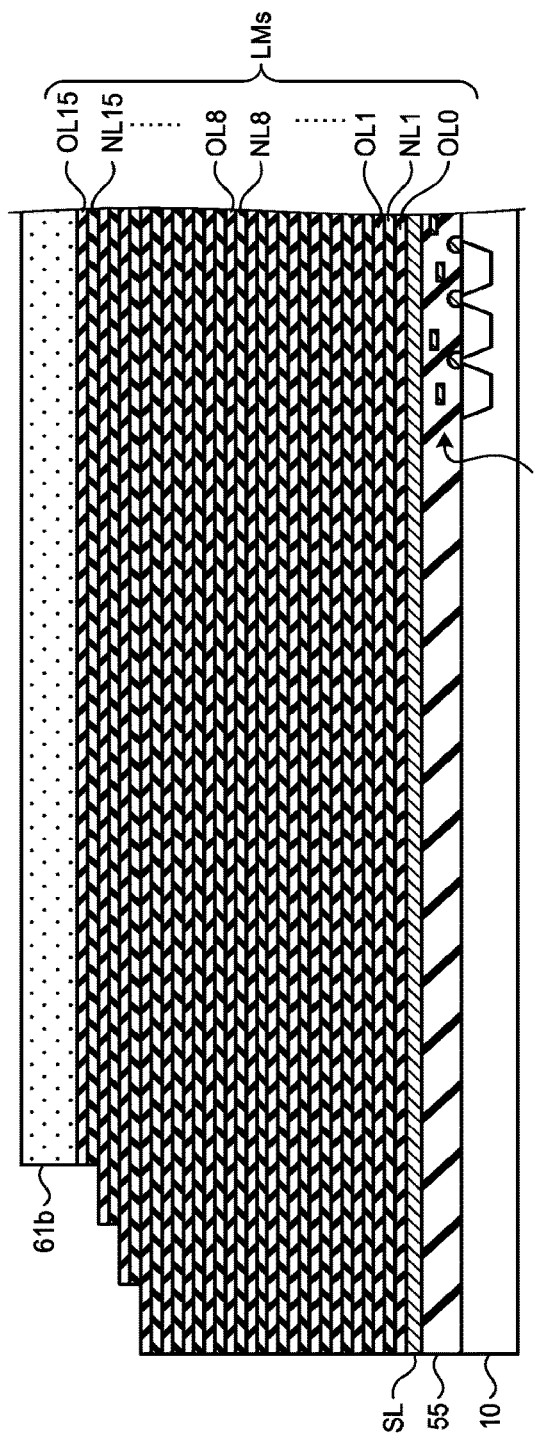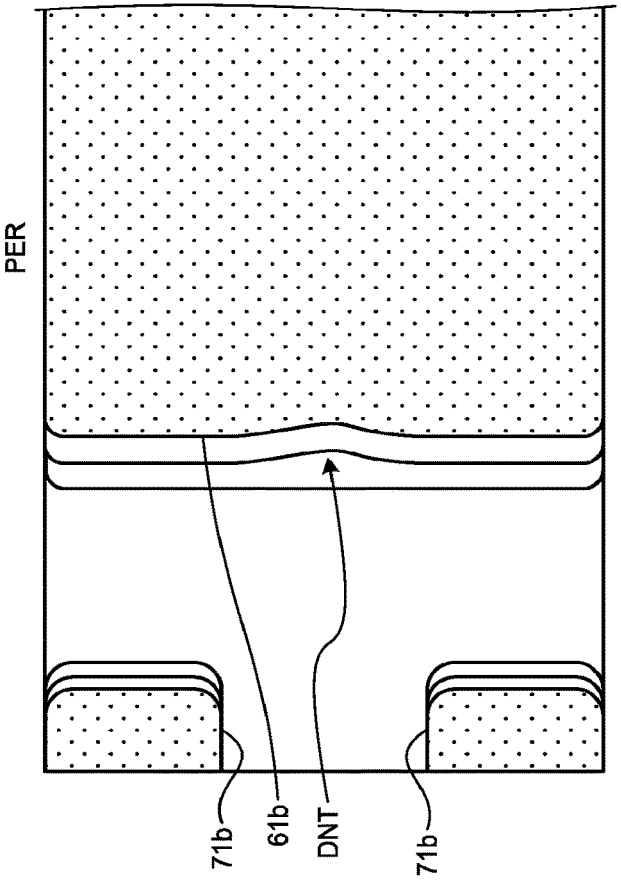
FIG. 9A
FIG. 9B

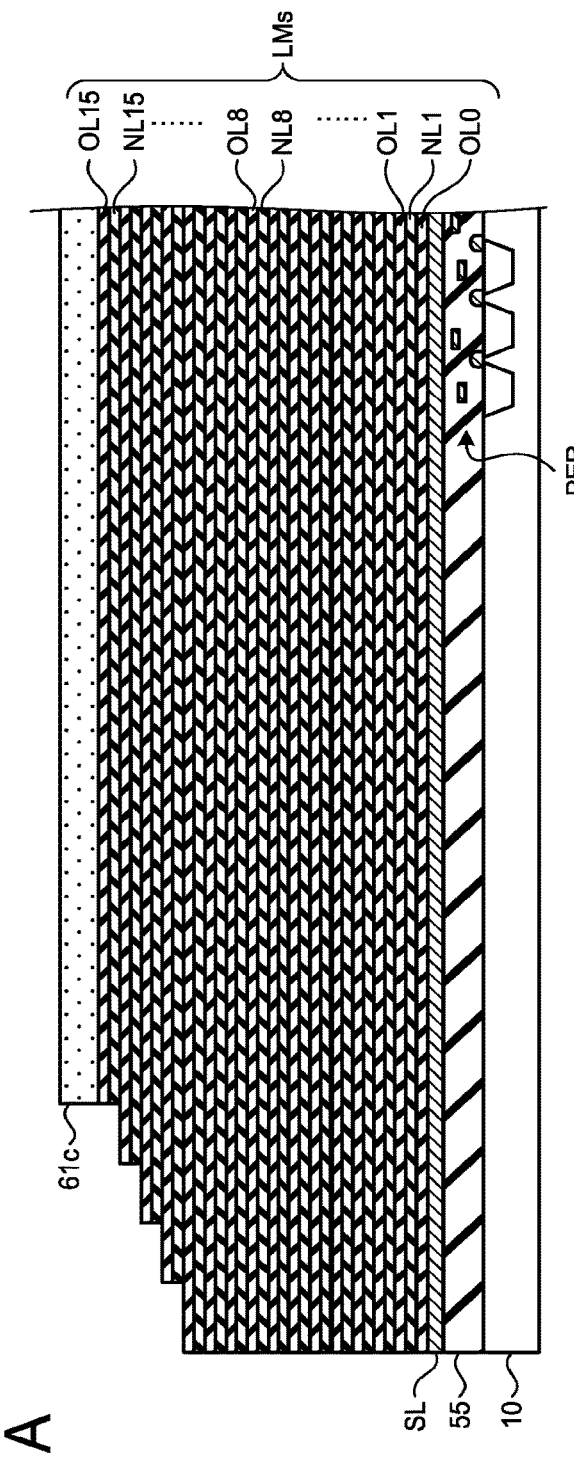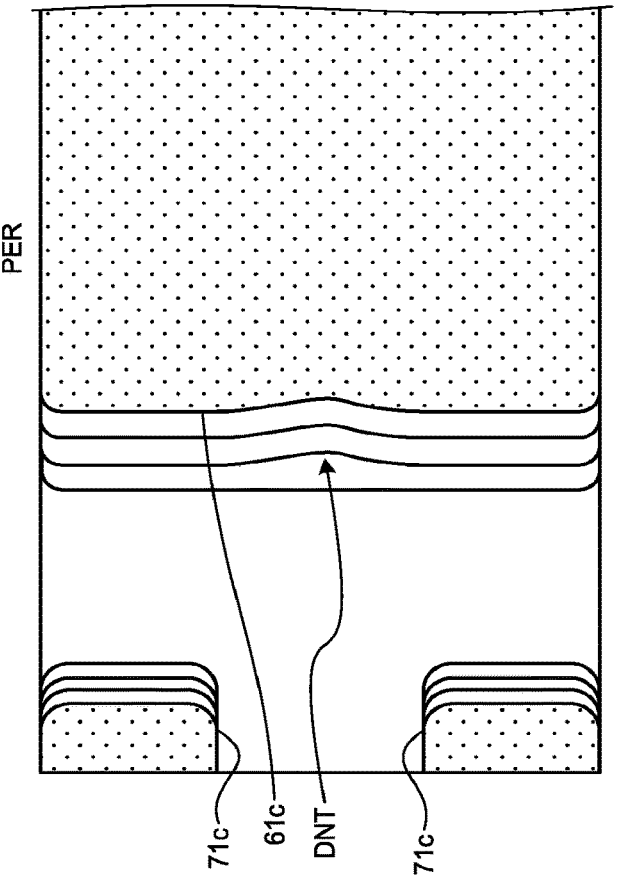

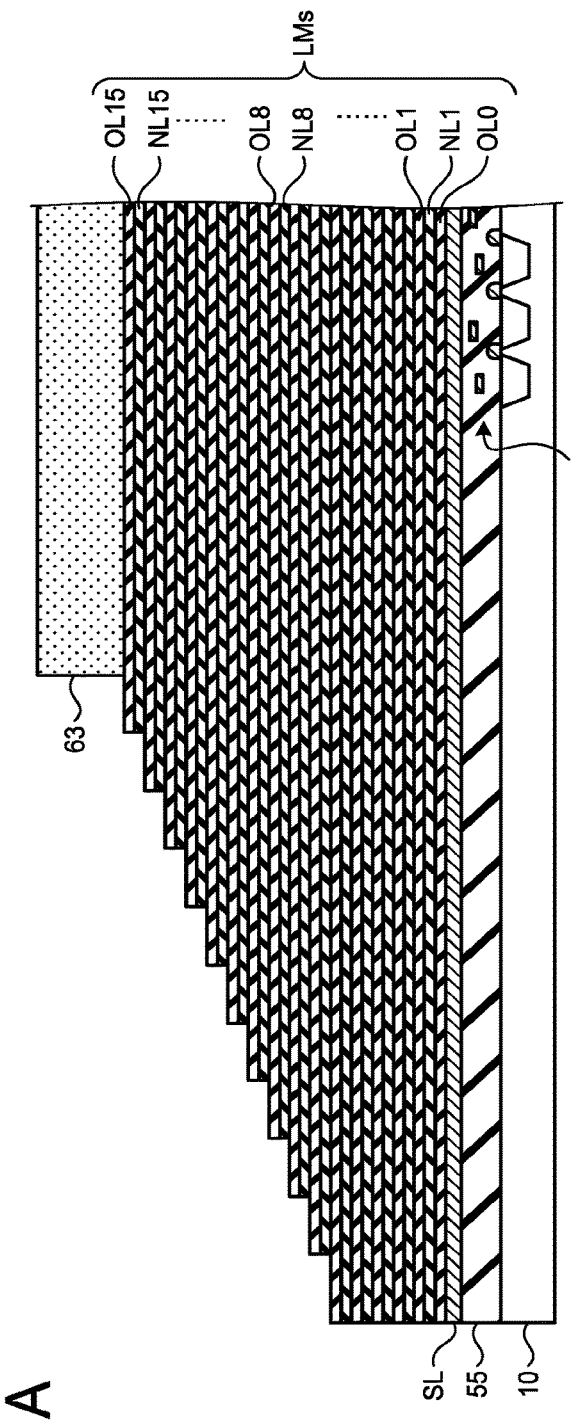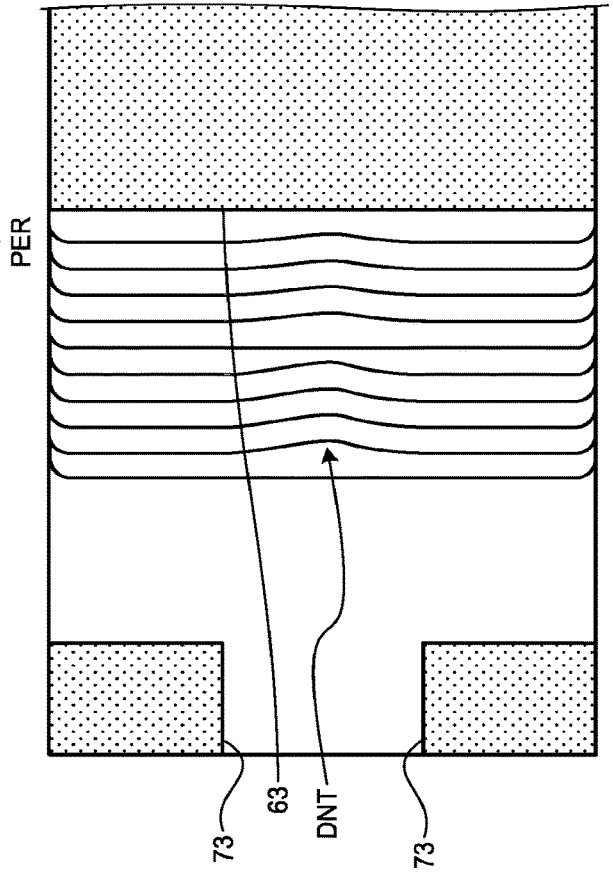
FIG.16A
FIG.16B

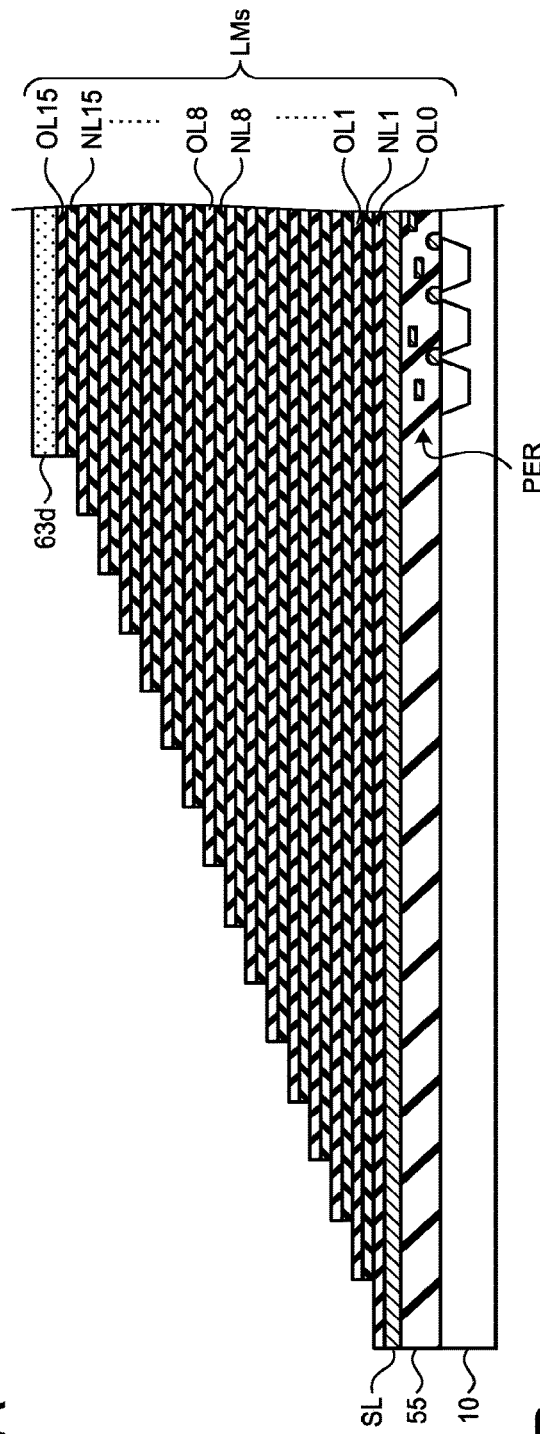
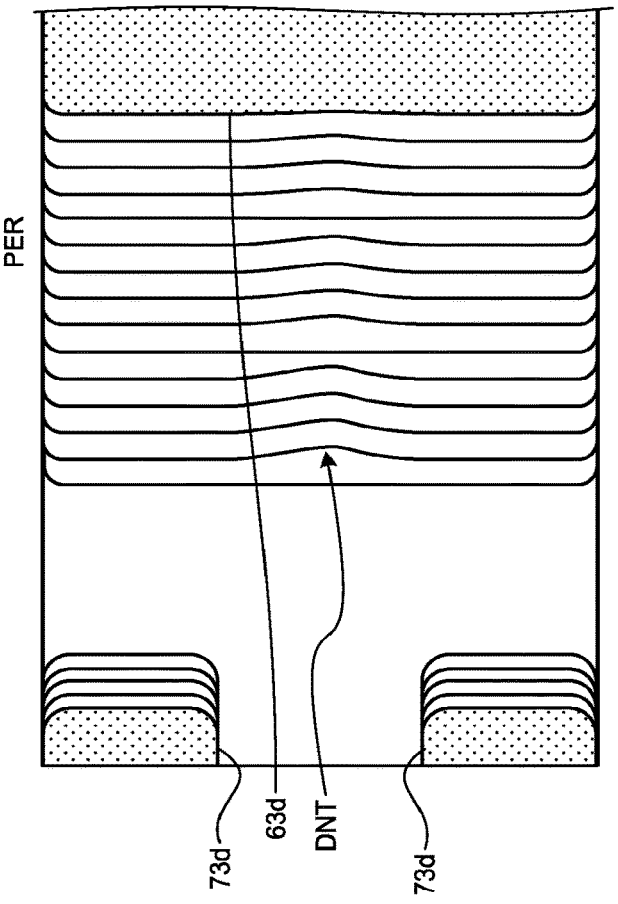
FIG.17A
FIG.17B

US 11,037,948 B2

SEMICONDUCTOR STORAGE DEVICE AND METHOD FOR MANUFACTURING SEMICONDUCTOR STORAGE DEVICE

CROSS-REFERENCE TO RELATED APPLICATIONS

This application is based upon and claims the benefit of priority from Japanese Patent Application No. 2019-044919, filed on Mar. 12, 2019; the entire contents of which are incorporated herein by reference.

FIELD

Embodiments described herein relate generally to a semiconductor storage device and a method for manufacturing a semiconductor storage device.

BACKGROUND

In recent years, miniaturization of semiconductor storage devices has progressed, and a three-dimensional stacked nonvolatile memory having memory cells in a stacked structure has been proposed. In the three-dimensional stacked nonvolatile memory, a stair-like structure is sometimes employed in order to lead out word lines in the respective layers of the memory cells arranged in the height direction. Such a stair-like structure can be obtained, for example, by etching the stacked structure while slimming a mask pattern.

BRIEF DESCRIPTION OF THE DRAWINGS

FIGS. 2A and 2B are views illustrating a detailed example of a partial configuration of the semiconductor storage device according to the embodiment;

FIGS. 5A and 5B are a cross-sectional view and a plan view illustrating one step of the method for manufacturing the semiconductor storage device according to the embodiment;

FIGS. 6A and 6B are a cross-sectional view and a plan view illustrating one step of the method for manufacturing the semiconductor storage device according to the embodiment;

FIGS. 8A and 8B are a cross-sectional view and a plan view illustrating one step of the method for manufacturing the semiconductor storage device according to the embodiment;

FIGS. 9A and 9B are a cross-sectional view and a plan view illustrating one step of the method for manufacturing the semiconductor storage device according to the embodiment;

FIGS. 11A and 11B are a cross-sectional view and a plan view illustrating one step of the method for manufacturing the semiconductor storage device according to the embodiment;

FIGS. 16A and 16B are a cross-sectional view and a plan view illustrating one step of the method for manufacturing the semiconductor storage device according to the embodiment;

FIGS. 17A and 17B are a cross-sectional view and a plan view illustrating one step of the method for manufacturing the semiconductor storage device according to the embodiment;

DETAILED DESCRIPTION

A semiconductor storage device according to an embodiment is the semiconductor storage device that includes: a cell array region having a plurality of memory cells; an outer edge portion arranged at an end portion to surround the cell array region; and a stacked body in which a plurality of conductive layers are stacked via a first insulating layer and which has a stair portion in which end portions of the plurality of conductive layers form a stair shape is provided inside the cell array region, the stair portion facing the outer edge portion. A center of at least one step of the stair portion has a recess directed to an inner side of the cell array region.

Hereinafter, the present invention will be described in detail with reference to the drawings. Incidentally, the present invention is not limited to the following embodiments. In addition, constituent elements in the following embodiments include those that can be easily assumed by those skilled in the art or those that are substantially the same.

(Configuration Example of Semiconductor Storage Device)

Figure 1A:
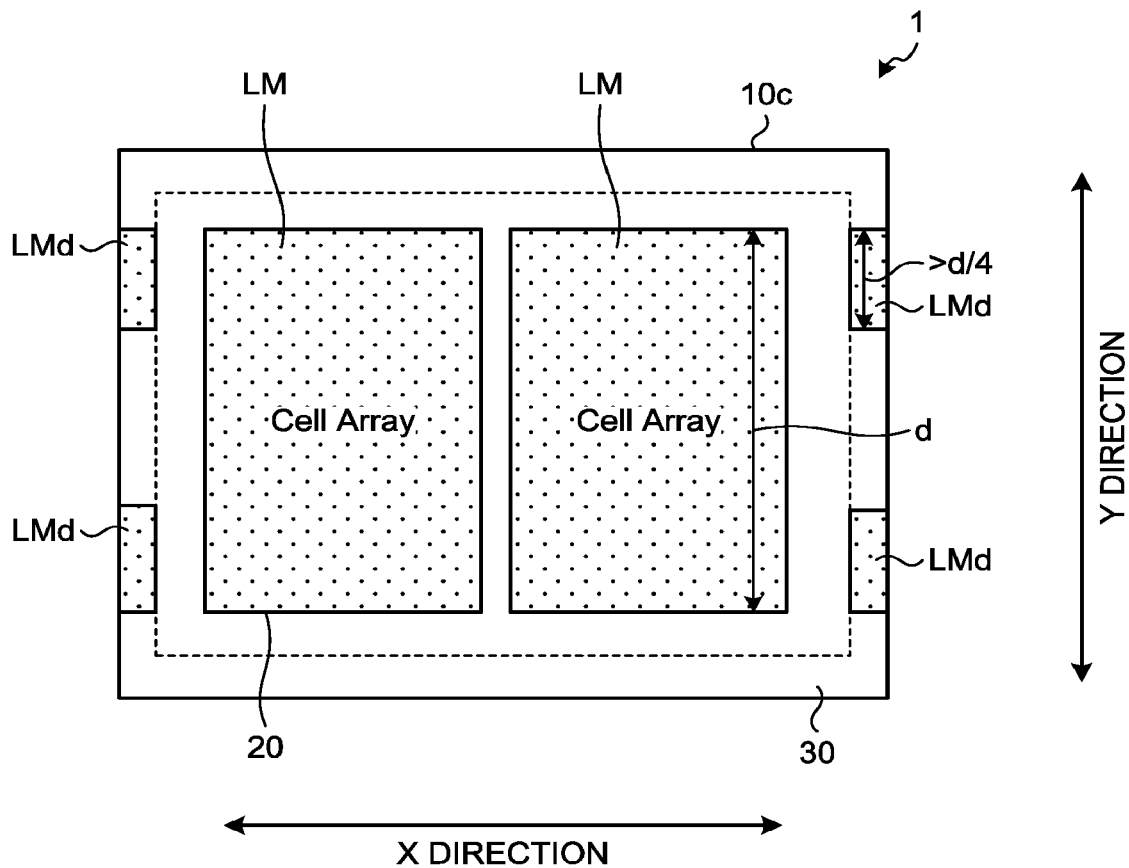
FIGS. 1A and 1B are views schematically illustrating an example of a configuration of a semiconductor storage device according to an embodiment.
Figure 1B:
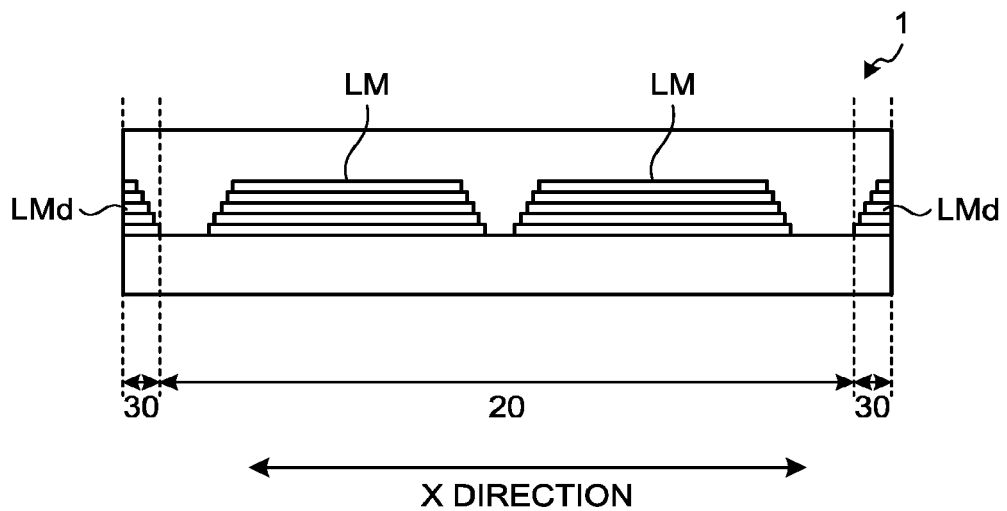

FIGS. 1A and 1B are views schematically illustrating an example of a configuration of a semiconductor storage device 1 according to an embodiment. FIG. 1A is a plan view of the semiconductor storage device 1 of the embodiment, and FIG. 1B is a cross-sectional view of the semiconductor storage device 1 of the embodiment taken along the X direction.

As illustrated in FIGS. 1A and 1B, the semiconductor storage device 1 includes a substrate 10c cut into a chip shape, a cell array region 20 arranged on the substrate 10c, and a scribe line 30 as an outer edge portion.

The cell array region 20 is a region in which a pattern to serve as a semiconductor element is formed. In addition, the scribe line 30 is a region in which a pattern such as an alignment mark to be used in a manufacturing process of the semiconductor storage device 1 is formed. The cell array region 20 is arranged at a center of the substrate 10c, and the scribe line 30 is arranged at an end portion of the substrate 10c to surround the cell array region 20.

The cell array region 20 has a plane including a memory portion in which memory cells serving as storage elements are arranged, and a peripheral circuit contributing to an operation of the memory cell. In the example of FIGS. 1A and 1B, the cell array region 20 has two planes. The individual planes can operate independently of one another by providing the memory portion with the peripheral circuit in each of the planes.

A stacked body LM formed of a plurality of layers is arranged inside each of the planes of the cell array region 20. The plurality of memory cells are three-dimensionally arranged in these stacked bodies LM. A detailed configuration of the stacked body LM will be described below.

A stacked body LMd formed of a plurality of layers is arranged at a predetermined position of the scribe line 30. No memory cell is arranged in the stacked body LMd, and the stacked body LMd is a dummy stacked body. A detailed configuration of the stacked body LMd will be described below.

Here, the arrangement of the stacked body LMd in the scribe line 30 will be described in more detail. The stacked body LMd is arranged at an end portion on the X direction side in the scribe line 30 and in the vicinity of a position opposing a corner of the cell array region 20. The corner of the cell array region 20 refers to a region of the cell array region 20 in which at least two directions are surrounded by scribe line 30, for example. That is, in the example of FIG. 1A and FIG. 1B, the stacked body LMd is arranged in four end portions of the scribe line 30 opposing the four corners of the cell array region 20 in the X direction.

More specifically, one stacked body LMd extends in the Y direction by a predetermined distance on the end portion of the scribe line 30 from a position opposing the corner of the cell array region 20 toward a position opposing the center of the cell array region 20. Meanwhile, the stacked body LMd is not formed at a position opposing the center of the cell array region 20. When a length of the cell array region 20 in the Y direction on a bottom surface of the stacked body LM is "d", it is preferable that a length of the scribe line 30 in the Y direction on the bottom surface of the stacked body LMd be larger than, for example, "d/4". In addition, it is preferable that two pairs of the stacked bodies LMd be arranged so as to be line-symmetric with each other with respect to a center line passing through the center of the cell array region 20 in the Y direction.

FIGS. 2A and 2B are views illustrating a detailed example of a partial configuration of the semiconductor storage device 1 according to the embodiment. FIG. 2A is a cross-sectional view of the semiconductor storage device 1 along the X direction in the plane, and FIG. 2B is a plan view including each part of the cell array region 20 and the scribe line 30 of the semiconductor storage device 1. Meanwhile, an insulating layer 56 on the stacked body LM, a plug CH connected to a pillar PL, and the like are omitted in FIG. 2B.

Incidentally, the vertical direction in the present specification is defined based on a shape of a stair portion STR to be described below. Specifically, a direction that a terrace portion of the stair portion SR, that is, an exposed surface of an interlayer insulating layer OL in each step of the stair portion STR faces is set as an upward direction.

As illustrated in FIGS. 2A and 2B, a peripheral circuit PER including a transistor and the like is arranged on the substrate 10c cut out from a wafer such as a silicon wafer, in the plane of the semiconductor storage device 1. The peripheral circuit PER is covered with an insulating layer 55. A source line SL configured using, for example, a polysilicon layer or the like is arranged on the insulating layer 55.

The stacked body LM in which a plurality of word lines WL serving as conductive layers and the insulating layers OL serving as first insulating layers are alternately stacked is arranged on the source line SL. The word line WL is, for example, a tungsten layer or a molybdenum layer. The insulating layer OL is, for example, a $SiO_2$ layer or the like. In the example of FIGS. 2A and 2B, fifteen word lines WL1 to WL15 and fifteen insulating layers OL1 to OL15 excluding the lowermost insulating layer OL0 are stacked. Meanwhile, the number of the stacked word lines WL and insulating layers OL is arbitrary.

The stacked body LM is divided in the Y direction by the slits ST serving as a plurality of strip portions extending substantially in the X direction. The slit ST has a groove-like structure penetrating through the stacked body LM, and the inside of the groove is filled with an insulating layer such as a $SiO_2$ layer. The slit ST may function as, for example, a source line contact or the like by filling the inside of the groove with a conductive layer having an insulating layer as a liner.

The stacked body LM includes a memory portion MEM in which a plurality of memory cells MC are arranged, and a stair portion STR in which end portions of the word lines WL and the insulating layers OL form a stair shape.

In the memory portion MEM, a plurality of the pillars PL which penetrate through the stacked body LM and reach the source line SL are arranged in a matrix. The pillar PL has a columnar structure, and includes a core layer CR, a channel layer CN, and a memory layer ME in the order from a center thereof. The channel layer CN is also arranged at a bottom of the pillar PL. The core layer CR is, for example, a $SiO_2$ layer or the like. The channel layer CN is, for example, an amorphous silicon layer or a polysilicon layer. The memory layer ME has a stacked structure of, for example, a SiO$_2$ layer/a SiN layer/a SiO$_2$ layer. For example, the plug CH connected to an upper layer wiring such as a bit line is arranged at an upper end of the channel layer CN.

With such a structure, the memory cell MC is formed at an intersection of the pillar PL and each of the word lines WL. A predetermined voltage is applied from the word line WL to the memory cell MC, and a predetermined charge is held in the memory cell MC, whereby the memory cell MC stores data in a nonvolatile manner. As a predetermined voltage is applied from the word line WL to the memory cell MC, the data stored in the memory cell MC is read.

However, one or more conductive layers including the lowermost conductive layer and the uppermost conductive layer of the stacked body LM may function as a select gate line. In this case, a select gate is formed at an intersection of the select gate line and the pillar PL. A predetermined voltage is applied from the select gate line to the select gate to turn on or off the select gate, whereby the memory cell MC formed in the predetermined pillar PL can be selected as the memory cell MC to be operated.

The stair portion STR has a stair-like shape in which the word line WL in one layer and the insulating layer OL on an upper layer of the one layer form one step, and step up toward the memory portion MEM. In the examples of FIGS. 2A and 2B, from the lower layer side, the word line WL1 and the insulating layer OL1 form the lowest step, the word line WL8 and the insulating layer OL8 form the eighth step, and the word line WL15 and the insulating layer OL15 form the uppermost step. That is, the stair portion STR faces the scribe line 30 on the left side in the longitudinal direction of FIGS. 2A and 2B.

The stair portion STR is entirely covered with the insulating layer 56, for example, to a height equal to an upper surface of the stacked body LM. A contact CC connected to an upper layer wiring is arranged at each step of the stair portion STR. The contact CC penetrates through the insulating layer 56 and the insulating layer OL in the upper layer of each step and is connected to the word line WL. With such a structure, the individual word lines WL can be led out and connected to the upper layer wiring.

In each step of the stair portion STR, the terrace portion which is a flat portion and a step portion which is a stepped portion substantially extends in a Y direction intersecting with an elevating direction (X direction) of the stair portion STR. At least some steps have dent portions DNT, recessed toward the memory portion MEM, at substantially centers thereof in the Y direction. In addition, at least some steps may have a rounded shape that retracts toward the memory portion MEM at both end portions in the Y direction. In this case, a tangent line between the terrace portion and the step portion of each step has an M shape. Incidentally, the substantially center in the Y direction of each step is a substantially center in the entire stair portion STR divided into three by the four slits ST. In addition, the both end portions in the Y direction of each step are both end portions in the entire stair portion STR divided into three by the four slits ST.

The stair portion STR has several regions AA, AB, and AC. The region AA is a region including the word line WL5 and the insulating layer OL5 of the fifth step from the word line WL2 and the insulating layer OL2 of the second step. The region AB is a region including the word line WL10 and the insulating layer OL10 of the tenth step from the word line WL7 and the insulating layer OL7 of the seventh step. The region AC is a region including the word line WL15 and the insulating layer OL15 of the fifteenth step from the word line WL12 and the insulating layer OL12 of the twelfth step.

A recess amount of the dent portion DNT becomes smaller as a step is located on an upper side, that is, a step farther from the scribe line 30 inside each of the regions AA, AB, and AC. For example, a recess amount of the dent portion DNT of the second step is the largest, and a recess amount of the dent portion DNT of the fifth step is the smallest inside the region AA. A recess amount of the dent portion DNT of the seventh step is the largest, and a recess amount of the dent portion DNT of the tenth step is the smallest inside the region AB. A recess amount of the dent portion DNT of the twelfth step is the largest, and a recess amount of the dent portion DNT of the fifteenth step is the smallest inside the region AC.

In addition, the recess amount of the dent portion DNT becomes smaller in an upper region, that is, a region farther from the scribe line 30 among the respective regions AA, AB, and AC. For example, the recess amount of the dent portion DNT of the second step in the region AA is larger than the recess amount of the dent portion DNT of the seventh step in the region AB, and the recess amount of the dent portion DNT of the seventh step in the region AB is larger than the recess amount of the dent portion DNT of the twelfth step in the region AC. In addition, the recess amount of the dent portion DNT of the fifth step in the region AA is larger than the recess amount of the dent portion DNT of the tenth step in the region AB, and the recess amount of the dent portion DNT of the tenth step in the region AB is larger than the recess amount of the dent portion DNT of the fifteenth step in the region AC.

Incidentally, the stacked body LM may have a stair-like shape even at the both end portions on the Y direction side.

The stacked body LMd is arranged on the insulating layer 55 that covers the substrate 10c on a side facing the stair portion STR in the scribe line 30 and in the vicinity of the both end portions of the stair portion STR in the Y direction.

The stacked body LMd has a structure in which a plurality of second insulating layers and third insulating layers are alternately stacked. The second insulating layer is, for example, a SiN layer or the like. The third insulating layer is, for example, a SiO$_2$ layer of the same type as the insulating layer OL constituting the stacked body LM.

The stacked body LMd has, for example, a stair portion STRd which has a stair-like shape and is stepped up to an end portion of the substrate 10c. That is, the stair portion STRd faces the cell array region 20 and opposes the stair portion STR inside the cell array region 20. Although the stair portion STRd has a stair shape having five steps in the example of FIG. 2B, the number of steps of the stair portion STRd is arbitrary. Incidentally, the stacked body LMd may have a stair-like shape even at the both end portions on the Y direction side.

The stair portion STRd is entirely covered with the insulating layer 56 up to a height equal to, for example, an upper end of the stacked body LMd, which is similar to the stair portion STR of the stacked body LM.

(Example of Method for Manufacturing Semiconductor Storage Device)

Figure 3:
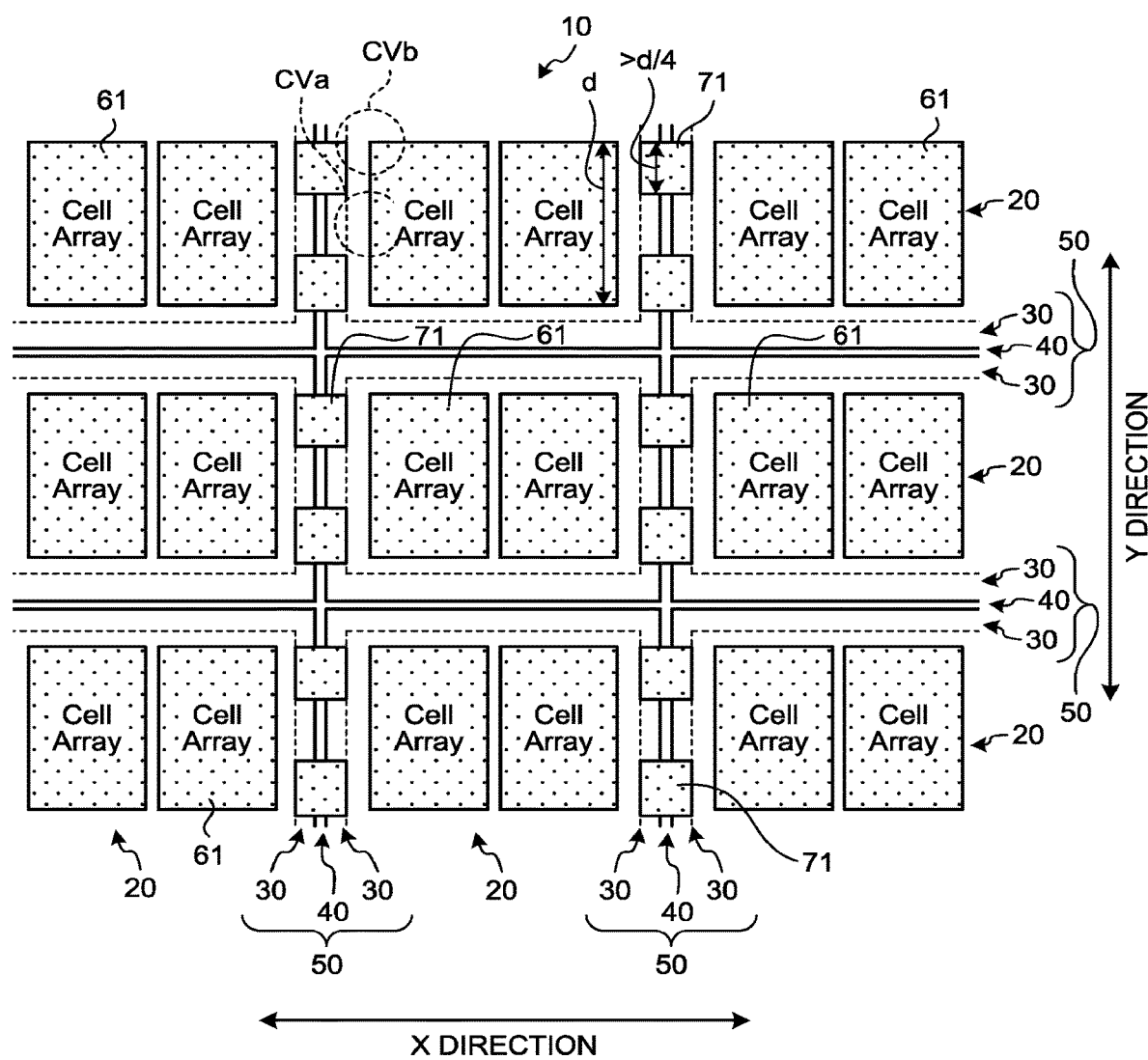
FIG. 3 is plan view illustrating an arrangement example of a resist pattern in one step of a method for manufacturing the semiconductor storage device according to the embodiment.

Next, an example of a method for manufacturing the semiconductor storage device 1 will be described with reference to FIGS. 3 to 19A and 19B. The respective drawings excluding FIG. 3 are cross-sectional views and plan views illustrating one step of the method for manufacturing the semiconductor storage device 1 according to the embodiment. In addition, A in each of FIGS. 4 to 17 is a cross-sectional view of a region to serve as the plane later, and corresponds to FIG. 2A. B in each of FIGS. 4 to 17 is a partial plan view of a region to serve as the cell array region 20 and the scribe line 30 later, and corresponds to FIG. 2B.

First, the peripheral circuit PER is formed on a wafer such as a silicon wafer before being cut into the substrate 10c, and the stacked body in which the plurality of second insulating layers and third insulating layers are alternately stacked is prepared. The peripheral circuit PER can be formed, for example, using a general semiconductor circuit formation method. Thereafter, a resist pattern that covers a part of the stacked body is formed.

FIG. 3 is a plan view illustrating an arrangement example of resist patterns 61 and 71 in one step of the method for manufacturing the semiconductor storage device 1 according to the embodiment. As illustrated in FIG. 3, the cell array regions 20 are arranged in a matrix on a wafer 10 via scribe lines 50 which are dicing lines. The scribe line 50 includes a scribe line 40 which is a region which disappears by dicing and the scribe line 30 which does not disappear but remains in the substrate 10c after dicing. The stacked body including the second insulating layer and the third insulating layer is formed on substantially the entire surface of the wafer 10.

In addition, the resist pattern 61 as a first mask pattern and the resist pattern 71 as a second mask pattern are formed on the wafer 10 to cover a part of the stacked body. The resist pattern 61 is formed to cover a portion to serve as the plane of the cell array region 20. The resist pattern 71 is formed across the scribe line 50, that is, two scribe lines 30 and one scribe line 40, between two planes aligned in the X direction.

More specifically, the resist pattern 71 extends in the Y direction from a position opposing a corner of the resist pattern 61 toward a center of the resist pattern 61 between the two planes aligned in the X direction. Meanwhile, the resist pattern 71 is not formed at a position opposing a center of the resist pattern 61.

Here, the corner of the resist pattern 61 refers to a region surrounded by the scribe line 30 in at least two directions, for example, among four corners of the resist pattern 61 that covers one plane. That is, inner corners of two planes in the cell array region 20 among a plurality of planes aligned in the X direction do not correspond to the above example. This is because the inner corner faces the scribe line 30 only in one direction, that is, the Y direction. Accordingly, among the four corners of the resist pattern 61 covering one plane, two corners facing an outer side of the cell array region 20 correspond to the above example, and the resist pattern 71 is arranged on each outer side of these two corners.

When a length of the single resist pattern 61 in the Y direction is "d", it is preferable that a length of the single resist pattern 71 in the Y direction be larger than "d/4", for example. In addition, it is preferable that two pairs of the resist patterns 71 be arranged in line-symmetric with each other with respect to a center line passing through the center of the single resist pattern 61 in the Y direction.

Since the resist patterns 61 and 71 are arranged in this manner, a total coverage CVa of the resist patterns 61 and 71 in the vicinity of the center of the resist pattern 61 is substantially equal to a total coverage CVb of the resist patterns 61 and 71 in the vicinity of the corner of the resist pattern 61 facing the outer side of cell array region 20. Here, each of the coverages CVa and CVb of the resist patterns 61 and 71 refers to the area of each region where the resist patterns 61 and 71 are formed per unit area of the wafer 10.

Figure 4A:
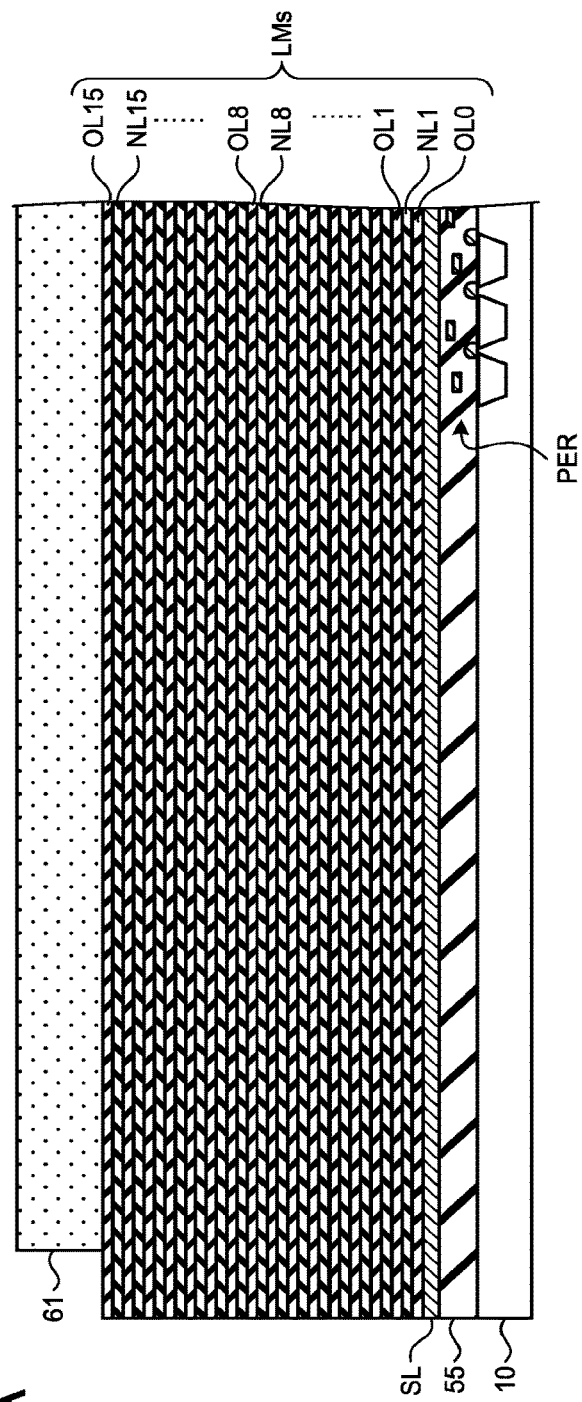
FIGS. 4A and 4B are a cross-sectional view and a plan view illustrating one step of the method for manufacturing the semiconductor storage device according to the embodiment.
Figure 4B:
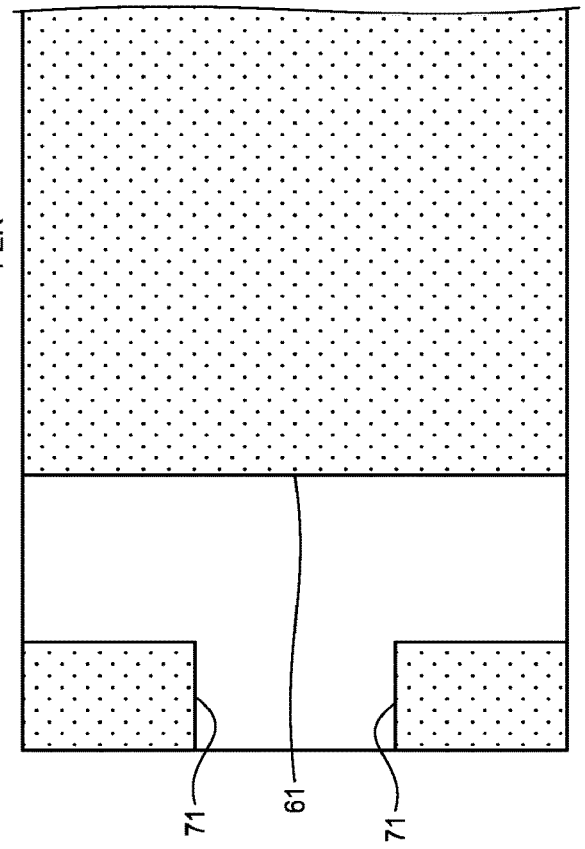

FIGS. 4A and 4B illustrate state where the resist patterns 61 and 71 are formed on a stacked body LMs in which a plurality of insulating layers NL as the second insulating layers and the insulating layers OL as the first insulating layers or third insulating layers are alternately stacked. The insulating layer NL is a sacrificial layer that can be replaced with a tungsten layer, a molybdenum layer or the like in a subsequent process, and is, for example, a SiN layer. The insulating layer OL is the same layer as the insulating layer OL constituting the above-described stacked bodies LM and LMd, and is, for example, a $SiO_2$ layer or the like.

An end portion of the resist pattern 61 on a side facing the scribe line 30 has a distance from the memory portion MEM substantially equal to that of the lowermost step portion of the stair portion STR to be formed later, that is, a distal end portion of the stair portion STR. The resist pattern 71 is arranged at a position where the stacked body LMd is to be formed later.

As illustrated in FIGS. 5A and 5B, the uppermost insulating layers OL15 and NL15 in an exposed portion of the stacked body LMs are removed using the resist pattern 61 as a mask. At this time, the resist pattern 71 is used as a mask to partially remove the insulating layers OL15 and NL15 even in the scribe line 30.

As illustrated in FIGS. 6A and 6B, the resist pattern 61 is slimmed by $O_2$ plasma or the like to form a resist pattern 61a. As a result, the resist pattern 61a recedes so that the uppermost insulating layers OL15 and NL15 are newly exposed. At this time, the amount of recession of the resist pattern 61a is set to, for example, the same degree as a width in the X direction of the terrace portion of one step of the stair portion STR to be formed later.

In addition, at this time, the resist pattern 71 is also slimmed by $O_2$ plasma or the like to form a resist pattern 71a. As described above, the total coverage of the resist patterns 61 and 71 in the vicinity of the center of the resist pattern 61 is substantially equal to the total coverage of the resist patterns 61 and 71 in the vicinity of the corner of the resist pattern 61. If the resist pattern 71 is brought close to the corner of the resist pattern 61 so that the coverages become equal in the vicinity of the center and in the vicinity of the corner of the resist pattern 61, a slimming rate of the resist pattern 61 is likely to be uniform in the vicinity of the center and in the vicinity of the corner as will be described below. Accordingly, the amount of recession of the resist pattern 61a becomes substantially equal in the vicinity of the center and in the vicinity of the corner.

According to the example of FIGS. 6A and 6B, the slimming rate of the resist pattern 61 is slightly faster in the vicinity of the center than in the vicinity of an end portion, and the amount of recession of the resist pattern 61a is slightly larger in the vicinity of the center than in the vicinity of the end portion. As a result, the end portion of the resist pattern 61a on a side facing the resist pattern 71a is recessed to the opposite side to the resist pattern 71a, that is, to an inner side of the cell array region 20, in the vicinity of the center in the Y direction.

Figure 7A:
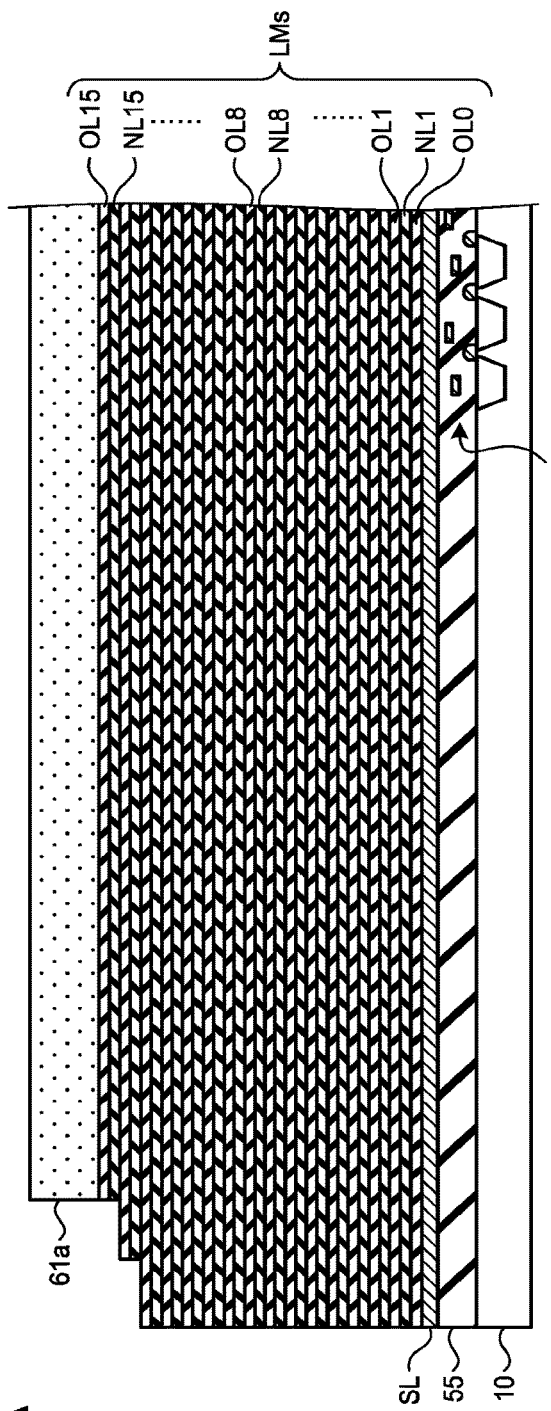
FIGS. 7A and 7B are a cross-sectional view and a plan view illustrating one step of the method for manufacturing the semiconductor storage device according to the embodiment.
Figure 7B:
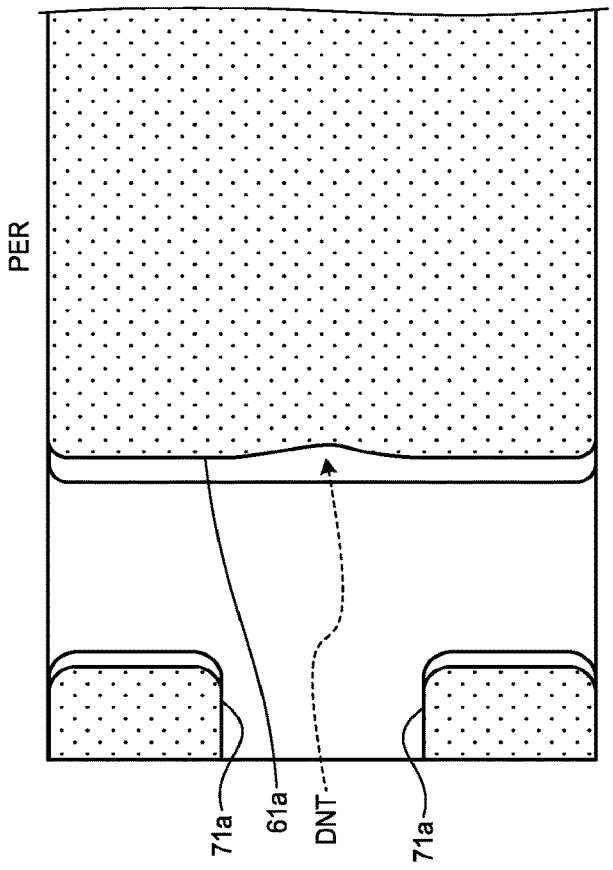

As illustrated in FIGS. 7A and 7B, the newly exposed uppermost insulating layers OL15 and NL15 of the stacked body LMs are removed using the resist pattern 61a as a mask. As a result, the insulating layers OL15 and NL15 form a shape having the dent portion DNT to which a shape of the resist pattern 61a has been transferred. In addition, the insulating layers OL14 and NL14 below the uppermost layer are removed in a portion of the stacked body LMs from which the insulating layers OL15 and NL15 have been already removed. The insulating layers OL14 and NL14 inherit the original shape of the resist pattern 61 to form a shape that does not have the dent portion DNT.

At this time, the resist pattern 71a is used as a mask to partially remove the insulating layers OL15 and NL15 and the insulating layers OL14 and NL14 even in the scribe line 30.

As illustrated in FIGS. 8A and 8B, the resist pattern 61a is slimmed by $O_2$ plasma or the like to form a resist pattern 61b. As a result, the resist pattern 61b recedes so that the uppermost insulating layers OL15 and NL15 are newly exposed.

At this time, the resist pattern 71a is also slimmed to form a resist pattern 71b, and an end portion of the resist pattern 61b on a side facing the resist pattern 71b is recessed to the opposite side to the resist pattern 71b in the vicinity of a center in the Y direction. However, a distance between the resist patterns 61a and 71a is larger than a distance between the resist patterns 61 and 71, and in this case, the influence of the resist pattern 71a on the slimming rate of the resist pattern 61a is slightly weakened. Thus, a recess amount of the resist pattern 61b is smaller than a recess amount of the resist pattern 61a.

As illustrated in FIGS. 9A and 9B, the newly exposed uppermost insulating layers OL15 and NL15 of the stacked body LMs are removed using the resist pattern 61b as a mask. As a result, the insulating layers OL15 and NL15 form a shape having the dent portion DNT to which a shape of the resist pattern 61b has been transferred.

In addition, the insulating layers OL14 and NL14 below the uppermost layer are removed in a portion of the stacked body LMs from which the insulating layers OL15 and NL15 have been already removed. The insulating layers OL14 and NL14 inherit the shape of the resist pattern 61a to form a shape that has the larger dent portion DNT than the insulating layers OL15 and NL15.

In addition, the insulating layers OL13 and NL13 on the next lower layer are removed in a portion of the stacked body LMs from which the insulating layers OL14 and NL14 have been already removed. The insulating layers OL13 and NL13 inherit the shape of the resist pattern 61 to form a shape that does not have the dent portion DNT.

At this time, the resist pattern 71b is used as a mask to sequentially remove a part of each of the insulating layers OL15 and NL15, a part of each of the insulating layers OL14 and NL14, and a part of each of the insulating layers OL13 and NL13 even in the scribe line 30.

Figure 10A:
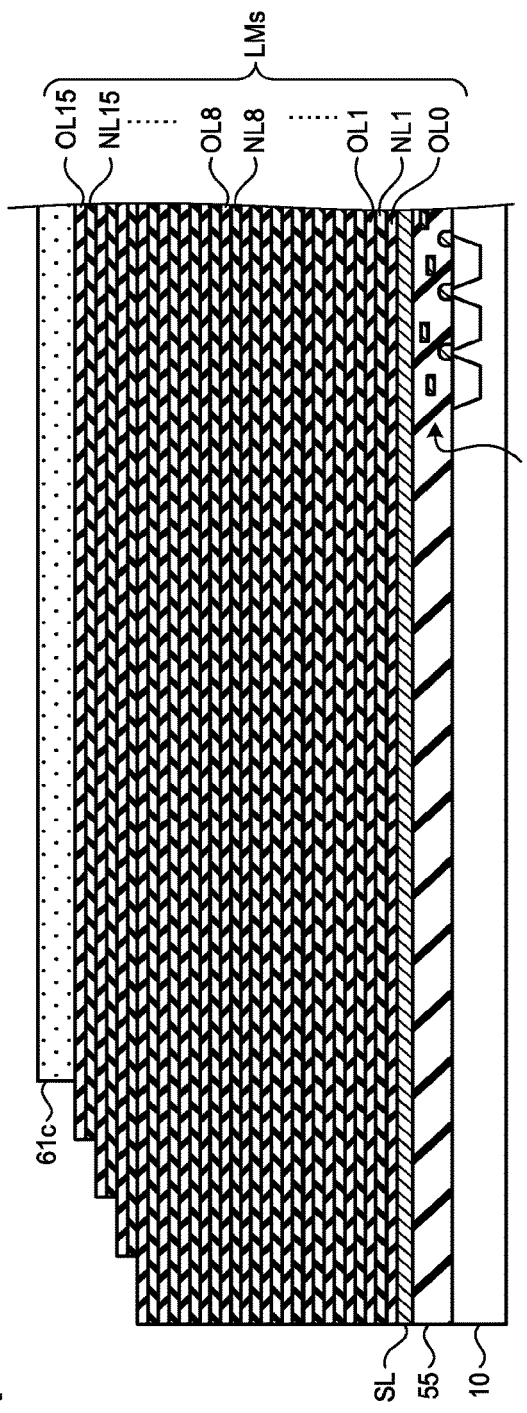
FIGS. 10A and 10B are a cross-sectional view and a plan view illustrating one step of the method for manufacturing the semiconductor storage device according to the embodiment.
Figure 10B:
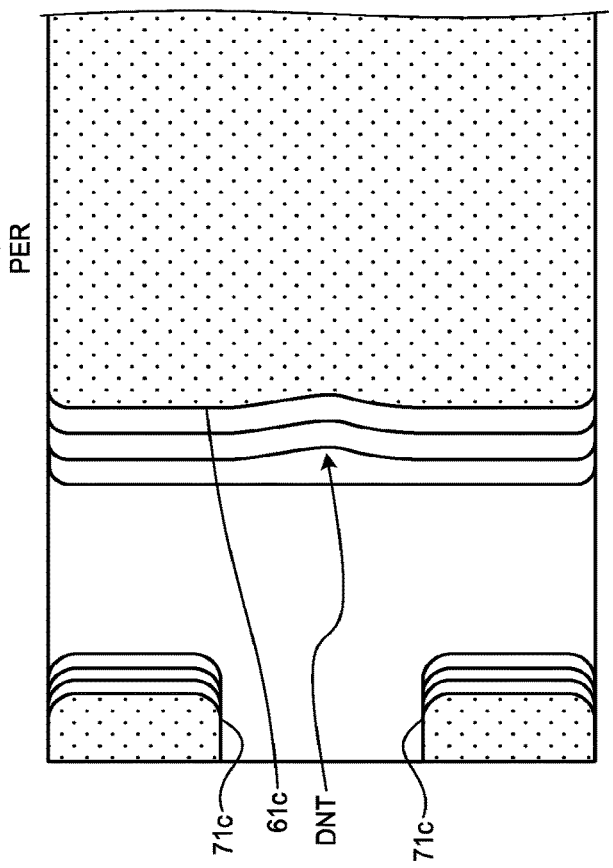
Figure 12A:
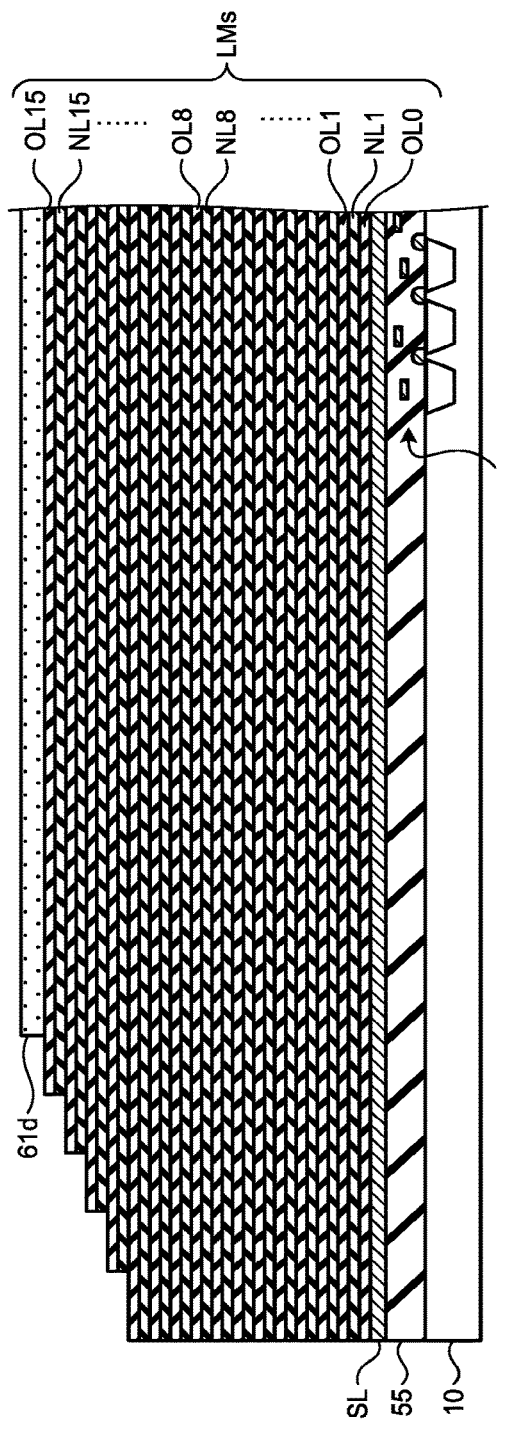
FIGS. 12A and 12B are a cross-sectional view and a plan view illustrating one step of the method for manufacturing the semiconductor storage device according to the embodiment.
Figure 12B:
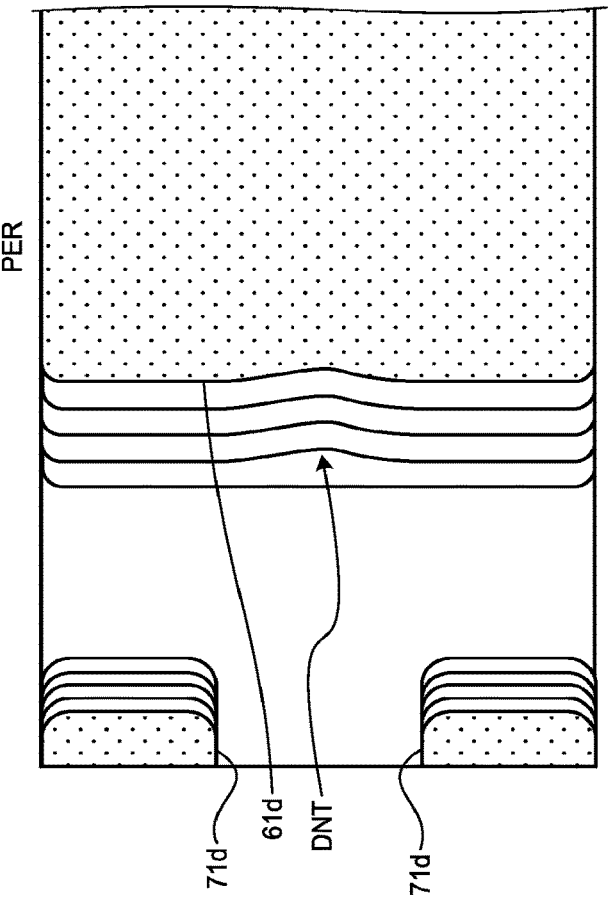
Figure 13A:
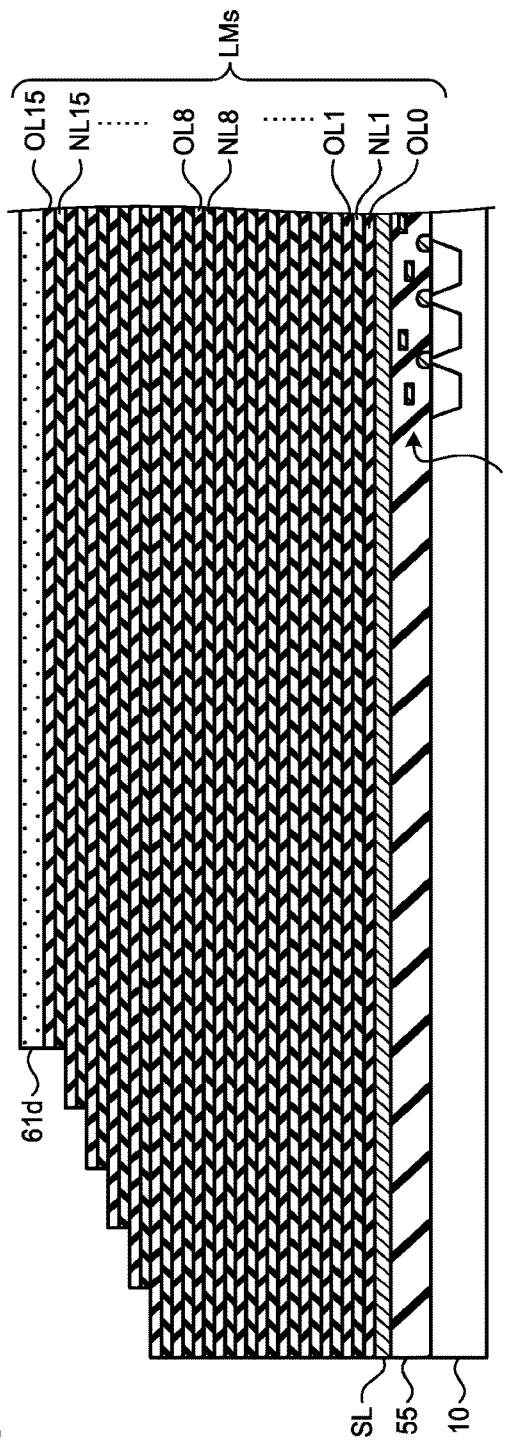
FIGS. 13A and 13B are a cross-sectional view and a plan view illustrating one step of the method for manufacturing the semiconductor storage device according to the embodiment.
Figure 13B:
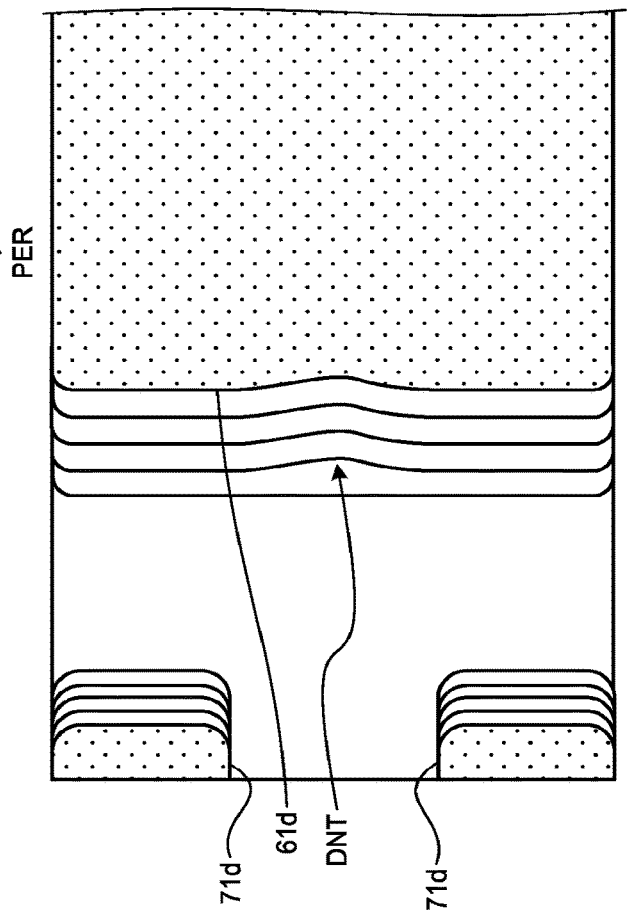

The resist patterns 61b and 71b are slimmed to form resist patterns 61c and 71c as illustrated in FIGS. 10A and 10B, and the insulating layers OL15 to OL12 and NL15 to NL12 are removed as illustrated in FIGS. 11A and 11B. In addition, the resist patterns 61c and 71c are slimmed to form resist patterns 61d and 71d as illustrated in FIGS. 12A and 12B, and the insulating layers OL15 to OL11 and NL15 to NL11 are removed as illustrated in FIGS. 13A and 13B.

As a result of these processes, the stair shape having five steps is formed in the insulating layers OL15 to OL11 and NL15 to NL11 of the stacked body LMs inside the cell array region 20. The lowermost insulating layers OL11 and NL11 inherit the shape of the resist pattern 61 and do not have the dent portion DNT. The other insulating layers OL15 to OL12 and NL15 to NL12 inherit shapes of the slimmed resist patterns 61a to 61d and have the dent portions DNT having a smaller recess amount in an upper layer.

Such shapes are inherited to the insulating layers OL5 to OL1 and the word lines WL5 to WL1 including the lowermost layer in the subsequent process. Among these layers, the insulating layers OL5 to OL2 and the word lines WL5 to WL2 are layers included in the region AA. In this manner, the above-described shape of each step of the region AA is formed due to the plurality of times of slimming of the resist pattern 61.

Meanwhile, the insulating layers OL15 to OL11 and NL15 to NL11 of the stacked body LMs in the scribe line 30 also have a stair shape.

Thereafter, the resist patterns 61d and 71d are stripped.

Figure 14A:
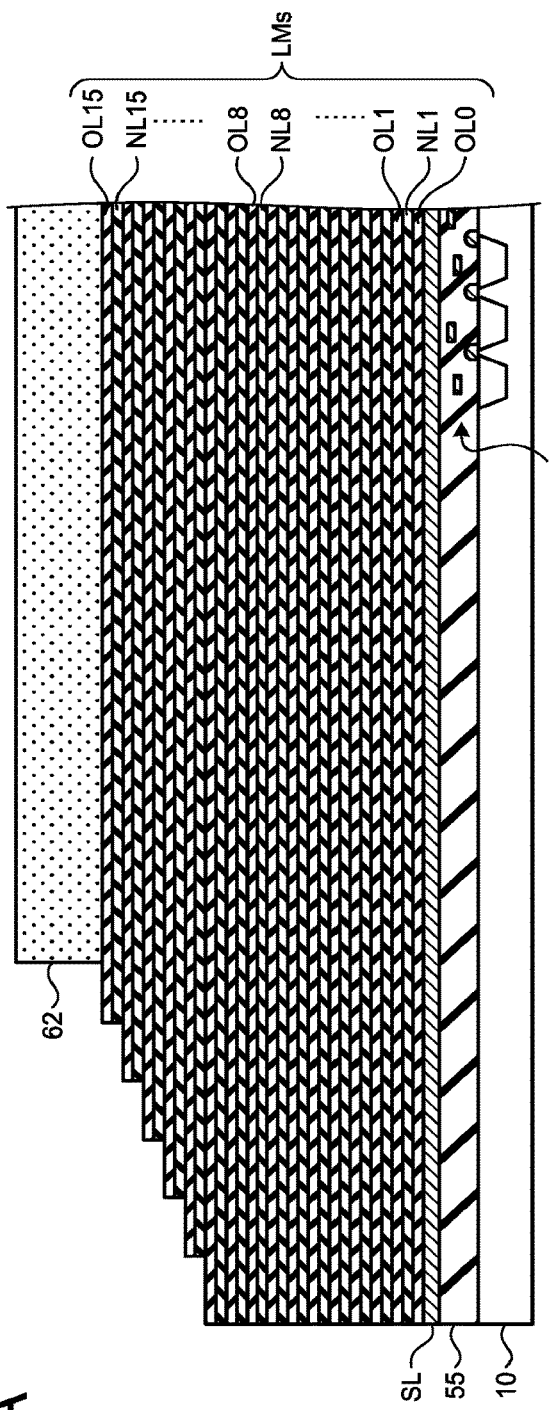
FIGS. 14A and 14B are a cross-sectional view and a plan view illustrating one step of the method for manufacturing the semiconductor storage device according to the embodiment.
Figure 14B:
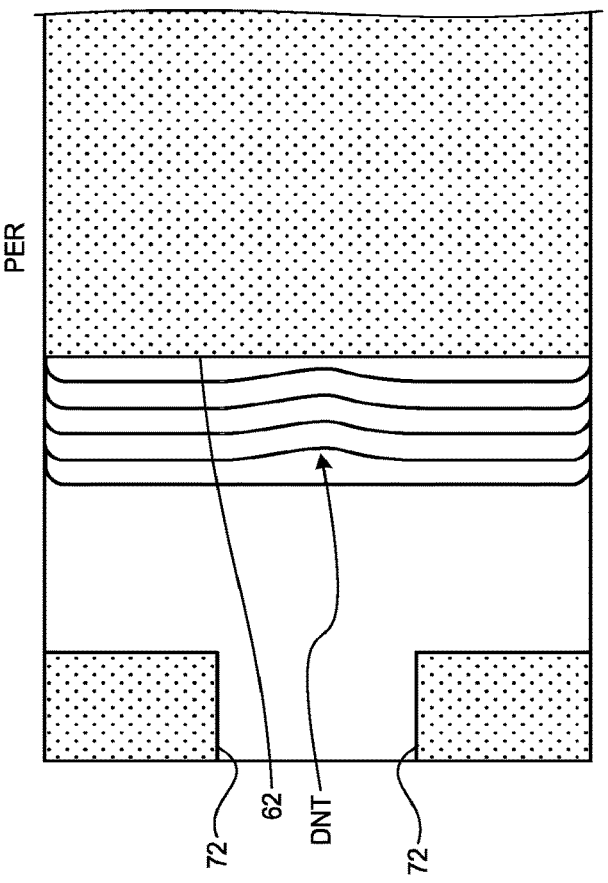

As illustrated in FIGS. 14A and 14B, resist patterns 62 and 72 are formed to partially cover the stacked body LMs. The resist pattern 62 is formed to cover a portion to serve as the plane of the cell array region 20. However, an end portion of the resist pattern 62 on a side facing the resist pattern 72 is arranged at a position receding from the resist pattern 72 by a width of the terrace portion from a position of the step portion of the uppermost insulating layer OL15 and NL15 formed last.

The resist pattern 72 is formed at substantially the same position as the resist pattern 71 across two scribe lines 30 and one scribe line 40 between two planes aligned in the X direction. That is, the resist pattern 72 is not formed at a position facing a center of the resist pattern 62, either.

Even in the resist patterns 62 and 72, a total coverage of the resist patterns 62 and 72 in the vicinity of the center of the resist pattern 62 is substantially equal to a total coverage of the resist patterns 62 and 72 in the vicinity of a corner of the resist pattern 62.

The newly exposed insulating layers OL15 to OL6 and NL15 to NL6 are sequentially removed to form a stair shape while slimming the resist patterns 62 and 72 similarly to FIGS. 4A and 4B to 13A and 13B described above.

Figure 15A:
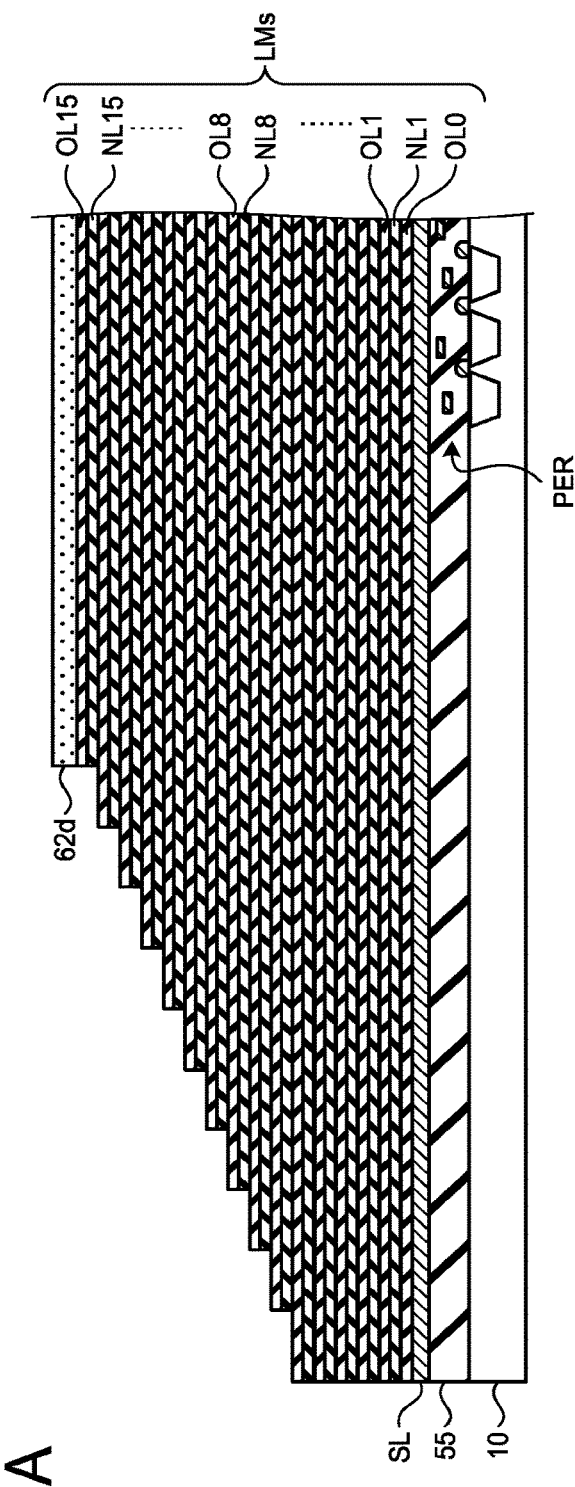
FIGS. 15A and 15B are a cross-sectional view and a plan view illustrating one step of the method for manufacturing the semiconductor storage device according to the embodiment.
Figure 15B:
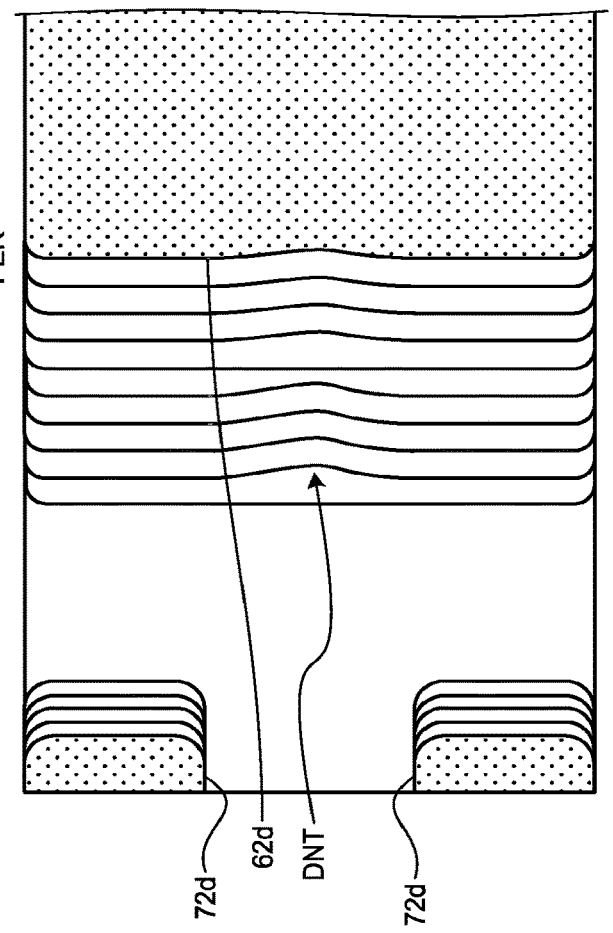

As illustrated in FIGS. 15A and 15B, the resist pattern 62 is slimmed to form a resist pattern 62d by repeating slimming and removing the insulating layers OL and NL, and a stair shape having ten steps is newly formed in the insulating layers OL15 to OL6 and NL15 to NL6 of the stacked body LMs inside the cell array region 20. The insulating layers OL10 to OL6 and NL10 to NL6 including the lowermost layer inherit shapes of the resist patterns 61 and 61a to 61d. The insulating layers OL7 and NL7 above the insulating layers OL6 and NL6 inherit the shape of the resist pattern 62 and do not have the dent portion DNT. The other insulating layers OL15 to OL11 and NL15 to NL11 inherit shapes of the slimmed resist patterns 62a to 62d and have the dent portions DNT having a smaller recess amount in an upper layer.

Meanwhile, originally, the resist patterns 62 and 72 are separated farther than the resist patterns 61 and 71. In this case, the influence of the resist patterns 72 and 72a to 72c on slimming rates of the resist patterns 62 and 62a to 62c is weaker than the influence of the resist patterns 71, 71a to 71c on slimming rates of the resist patterns 61 and 61a to 61c in the slimming of the resist patterns 62 and 72. Thus, each recess amount of the resist patterns 62a to 62d is relatively smaller than each recess amount of the resist patterns 61a to 61d. Accordingly, each recess amount of the dent portions DNT of the insulating layers OL15 to OL12 and NL15 to NL12 is also relatively smaller than each recess amount of the dent portions DNT of the insulating layers OL10 to OL7 and NL10 to NL7.

Such shapes of the insulating layers OL15 to OL11 and NL15 to NL11 are inherited to the insulating layers OL10 to OL6 and the word lines WL10 to WL6 in the subsequent process. Among these layers, the insulating layers OL10 to OL7 and the word lines WL10 to WL7 are layers included in the region AB. In this manner, the above-described shape of each step of the region AB is formed due to the plurality of times of slimming of the resist pattern 62.

Meanwhile, a stair shape is newly formed in the insulating layers OL15 to OL6 and NL15 to NL6 of the stacked body LMs inside the scribe line 30. However, there is a case where the stair shape of the stacked body LMs inside the scribe line 30 is not a regular shape like, for example, the stair shape of the stacked body LMs inside the cell array region 20 since the resist pattern 72 is formed at substantially the same position as the resist pattern 71 inside the scribe line 30. In addition, there is a case where the number of steps of the stair shape inside the scribe line 30 is different from the number of steps of the stair shape inside the cell array region 20, for example.

Thereafter, the resist patterns 62d and 72d are stripped.

As illustrated in FIGS. 16A and 16B, resist patterns 63 and 73 are formed to partially cover the stacked body LMs. The resist pattern 63 is formed to cover a portion to serve as the plane of the cell array region 20. However, an end portion of the resist pattern 63 on a side facing the resist pattern 73 is arranged at a position receding from the resist pattern 73 by a width of the terrace portion more than a position of the step portion of the uppermost insulating layer OL15 and NL15 formed last.

The resist pattern 73 is formed at substantially the same position as the resist patterns 71 and 72 across two scribe lines 30 and one scribe line 40 between two planes aligned in the X direction. That is, the resist pattern 73 is not formed at a position facing a center of the resist pattern 63, either.

Even in the resist patterns 63 and 73, a total coverage of the resist patterns 63 and 73 in the vicinity of the center of the resist pattern 63 is substantially equal to a total coverage of the resist patterns 63 and 73 in the vicinity of a corner of the resist pattern 63.

The newly exposed insulating layers OL5 to OL1 and NL5 to NL1 are sequentially removed to form a stair shape while slimming the resist patterns 63 and 73 similarly to FIGS. 4A and 4B to 13A and 13B or FIGS. 14A and 14B to 15A and 15B described above.

As illustrated in FIGS. 17A and 17B, the resist pattern 63 is slimmed to form a resist pattern 63d by repeating slimming and removing the insulating layers OL and NL, and a stair shape having fifteen steps is newly formed in the insulating layers OL15 to OL1 and NL15 to NL1 of the stacked body LMs inside the cell array region 20. The insulating layers OL5 to OL1 and NL5 to NL1 including the lowermost layer inherit shapes of the resist patterns 61 and 61a to 61d. The insulating layers OL10 to OL6 and NL10 to NL6 above the insulating layers OL5 and NL5 inherit shapes of the resist patterns 62 and 62a to 62d. The insulating layers OL11 and NL11 above the insulating layers OL10 and NL10 inherit the shape of the resist pattern 63 and do not have the dent portion DNT. The other insulating layers OL15 to OL12 and NL15 to NL12 inherit shapes of the slimmed resist patterns 63a to 63d and have the dent portions DNT having a smaller recess amount in an upper layer.

The resist patterns 63 and 73 are separated still farther than the resist patterns 62 and 72. Thus, each recess amount of the resist patterns 63a to 63d is relatively smaller than each recess amount of the resist patterns 62a to 62d. Accordingly, each recess amount of the dent portions DNT of the insulating layers OL15 to OL12 and NL15 to NL12 is also relatively still smaller than each recess amount of the dent portions DNT of the insulating layers OL10 to OL7 and NL10 to NL7.

Such shapes of the insulating layers OL15 to OL11 and NL15 to NL11 are inherited to the insulating layers OL15 to OL11 and the word lines WL15 to WL11 in the subsequent process. Among these layers, the insulating layers OL15 to OL12 and word lines WL15 to WL12 are layers included in the region AC. In this manner, the above-described shape of each step of the region AC is formed due to the plurality of times of slimming of the resist pattern 63.

Meanwhile, a stair shape is newly formed in the insulating layers OL15 to OL1 and NL15 to NL1 of the stacked body LMs inside the scribe line 30. As a result, the stacked body LMs inside the cell array region 20 and the stacked body LMs inside the scribe line 30 are divided, and the dummy stacked body LMd having the stair shape is obtained inside the scribe line 30.

However, there is a case where the stair shape of the stacked body LMd inside the scribe line 30 is not a regular shape like, for example, the stair shape of the stacked body LMd inside the cell array region 20 since the resist pattern 73 is formed at substantially the same position as the resist patterns 71 and 72 inside the scribe line 30. In addition, there is a case where the number of steps of the stair shape inside the scribe line 30 is different from the number of steps of the stair shape inside the cell array region 20, for example.

Incidentally, the formation of the stair shape has been mainly described in the X direction, that is, on the side where the stacked bodies LM and LMd oppose each other in the above example. However, the resist patterns 61 to 63 and 71 to 73 are slimmed not only in the X direction but also in the Y direction in the slimming of the resist patterns 61 to 63 and 71 to 73. Accordingly, a stair shape may be formed on the Y direction side of the stacked bodies LM and LMd.

Thereafter, the resist patterns 63d and 73d are stripped.

Figure 18A:
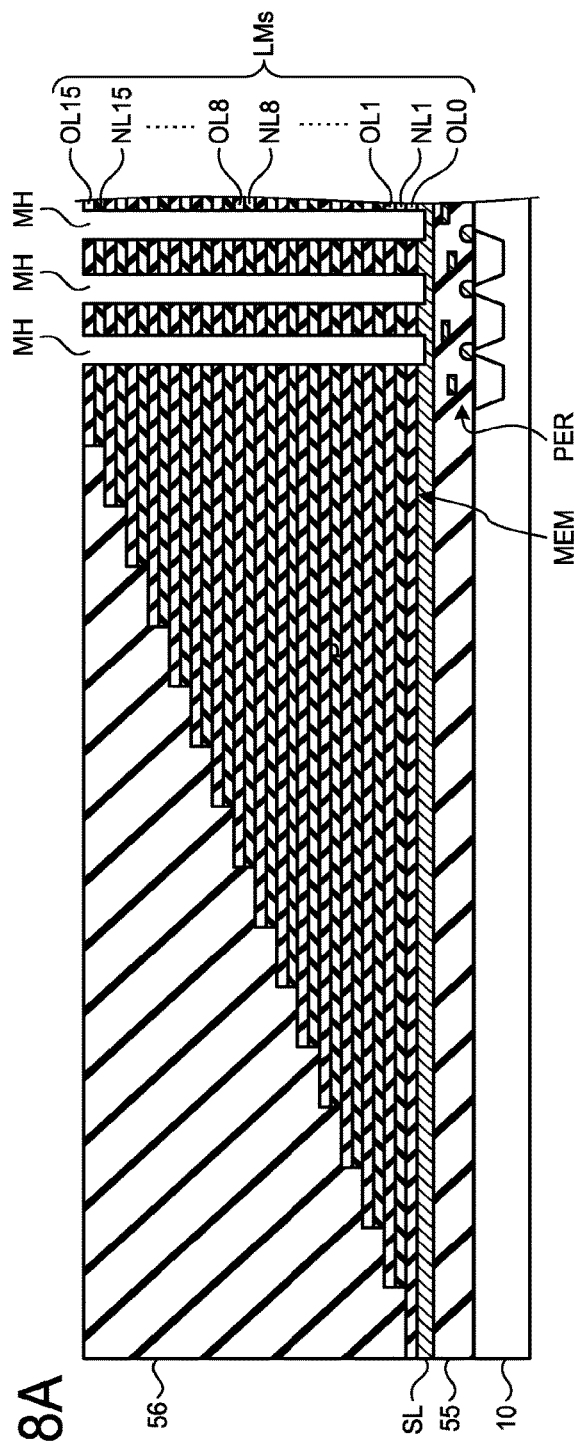
FIGS. 18A and 18B are a cross-sectional view and a plan view illustrating one step of the method for manufacturing the semiconductor storage device according to the embodiment.

As illustrated in FIG. 18A, the insulating layer 56 is formed, for example, up to the height of the upper surface of the stacked body LMs so as to cover the stair shape formed in the stacked body LMs of the memory portion MEM. At this time, the stacked body LMd of the scribe line 30 is also covered with the insulating layer 56. In addition, the plurality of memory holes MH which penetrate through the stacked body LMs and reach the source line SL are formed on an inner side of the stair shape of the stacked body LMs.

Figure 18B:
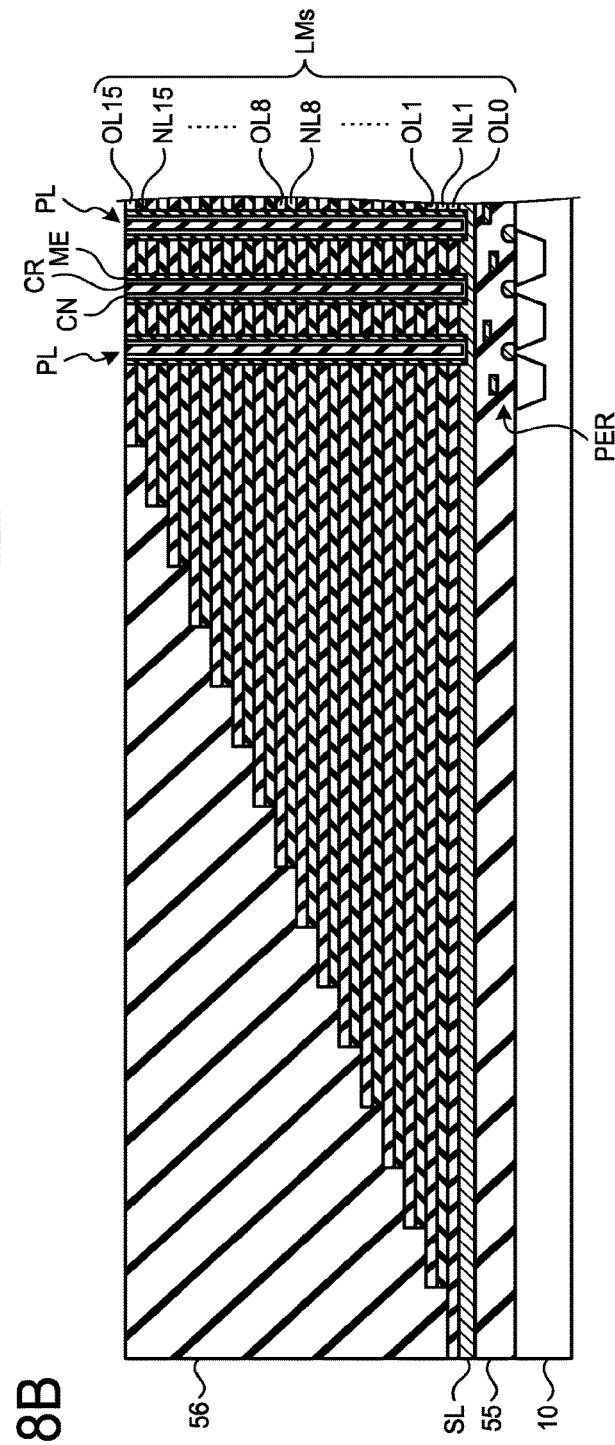

As illustrated in FIG. 18B, the memory layer ME, the channel layer CN, and the core layer CR are sequentially formed from an inner wall side of the memory hole MH. The channel layer CN is also formed at the bottom of the memory hole MH. As a result, the plurality of pillars PL are formed.

Thereafter, the plurality of slits ST (see FIG. 2B) penetrating through the stacked body LMs and extending in the X direction inside the memory portion MEM are formed. At this point in time, the slit ST is filled with nothing.

Figure 19A:
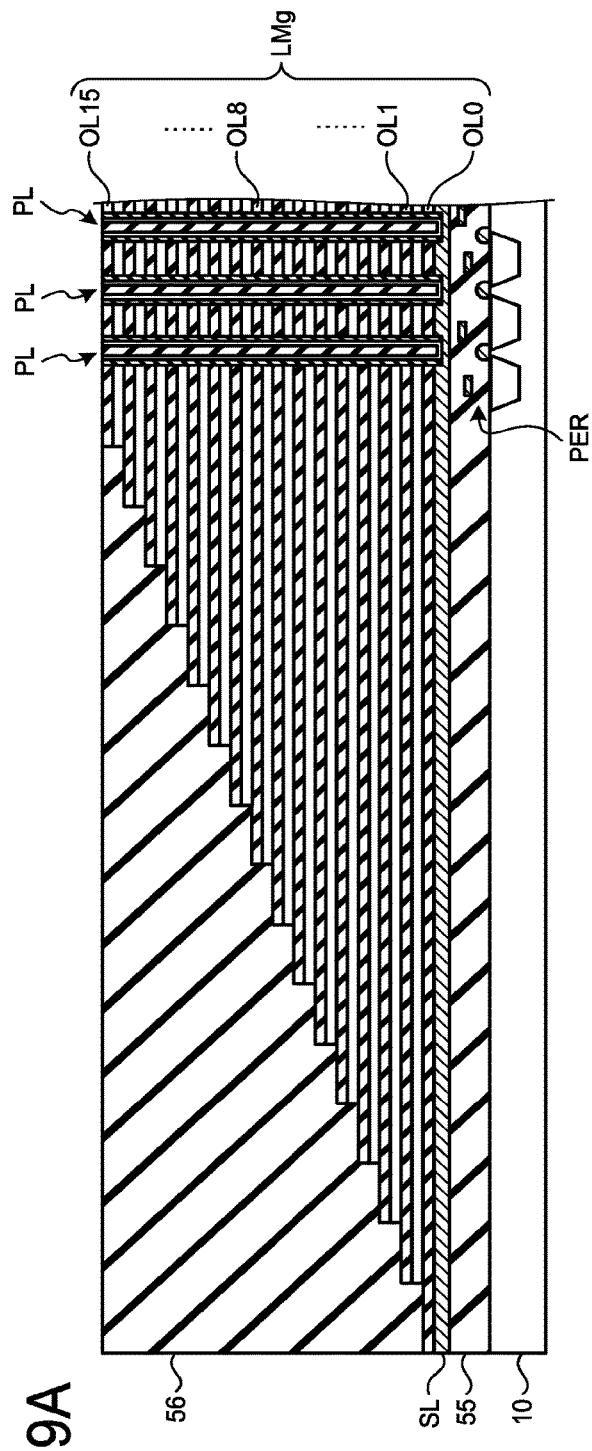
FIGS. 19A and 19B are a cross-sectional view and a plan view illustrating one step of the method for manufacturing the semiconductor storage device according to the embodiment.

As illustrated in FIG. 19A, the insulating layer NL of the stacked body LMs inside the memory portion MEM is removed through the slit ST. As a result, a stacked body LMg having a gap from which the insulating layer NL has been removed is formed between the plurality of insulating layers OL. However, the slit ST is not formed inside the scribe line 30, and the insulating layer NL of the stacked body LMd inside the scribe line 30 is not removed.

Figure 19B:
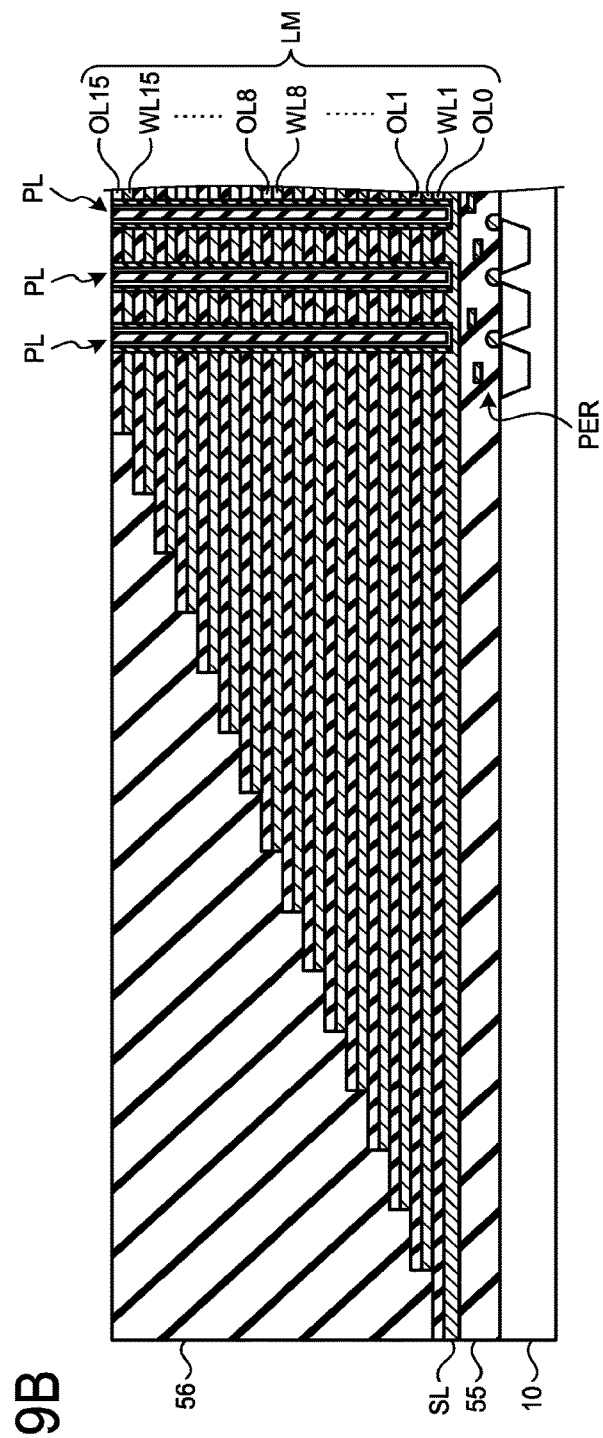

As illustrated in FIG. 19B, the gap between the insulating layers OL of the stacked body LMg is filled with a conductive material such as tungsten or molybdenum via the slit ST. As a result, the word line WL is stacked between the plurality of insulating layers OL, and the stacked body LM having the stair portion STR at the end portion is formed. However, the slit ST is not formed inside the scribe line 30, and the insulating layer NL of the stacked body LMd inside the scribe line 30 is not replaced with the word line WL.

Thereafter, the plug CH is formed on the channel layer CN of the pillar PL, the contact CC is formed on each step of the stair portion STR, and the upper layer wiring thereof is formed.

In addition, the wafer 10 in which these structures have been formed is diced along the scribe line 50 and cut into the substrates 10c. At this time, not only the wafer 10 constituting the scribe line 40 but also the stacked body LMd formed on the scribe line 40 disappear, and the semiconductor storage device 1 in which the stacked body LMd is arranged at the end portion of the scribe line 30 is manufactured.

As above, the manufacturing process of the semiconductor storage device 1 of the embodiment is ended.

Comparative Example

Figure 20A:
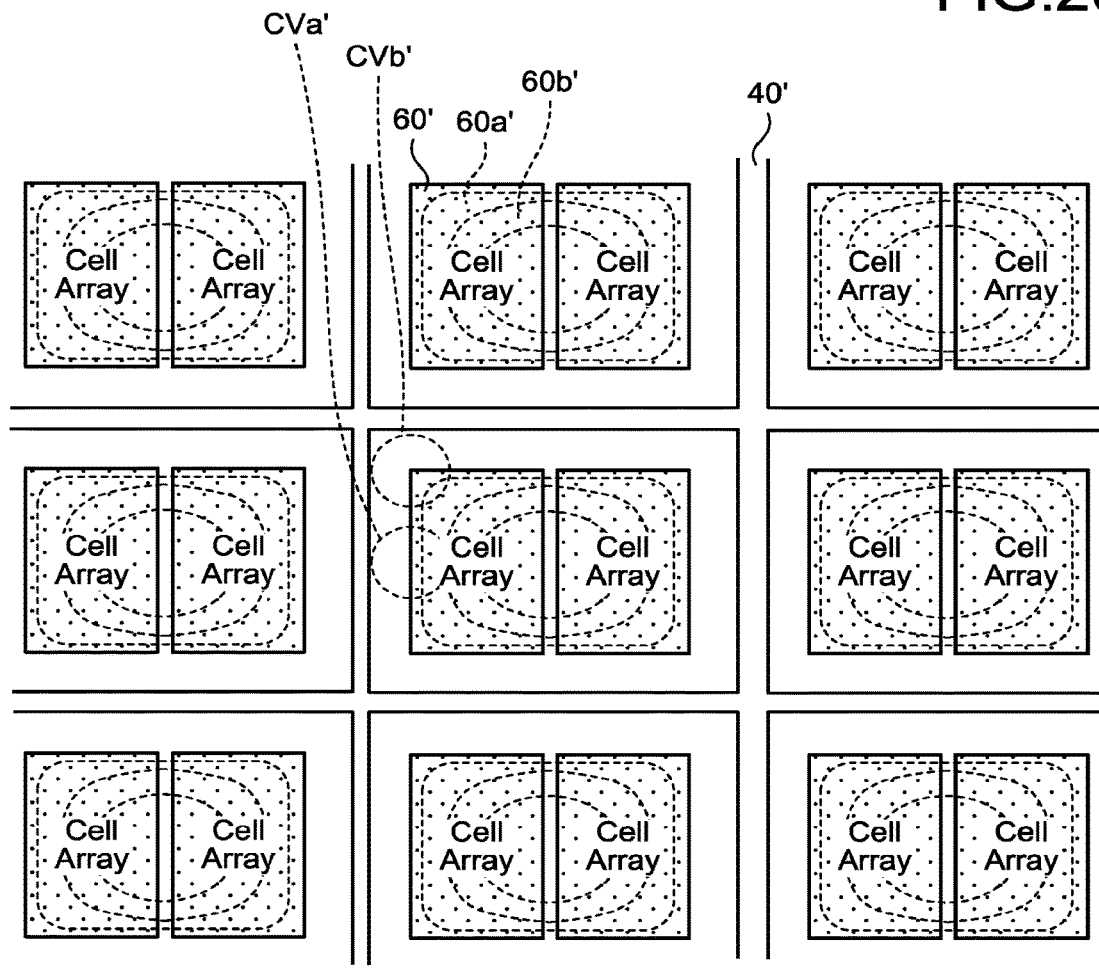
FIGS. 20A and 20B are a cross-sectional view and a plan view illustrating one step of a method for manufacturing a semiconductor storage device according to a comparative example.
Figure 20B:
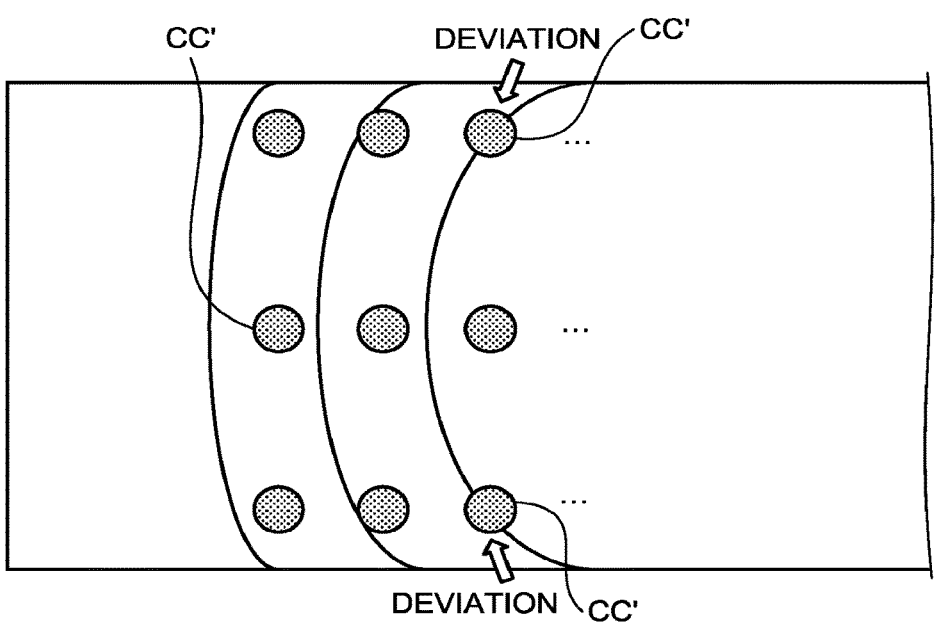

FIG. 20A and FIG. 20B are views illustrating an example of a manufacturing process of a semiconductor storage device according to a comparative example.

As illustrated in FIG. 20A, a resist pattern is not arranged on a scribe line 40' or the like at the time of slimming of a resist pattern 60' in the manufacturing process of the semiconductor storage device of the comparative example. Thus, a coverage CVb' in the vicinity of a corner of the resist pattern 60' facing the scribe line 40' is smaller than a coverage CVa' in the vicinity of a center of the resist pattern 60'.

As a result, an etchant in $O_2$ plasma in the vicinity of the corner of the resist pattern 60' is likely to be more excessive than that in vicinity of the center of the resist pattern 60' during the slimming. Accordingly, a slimming rate in the vicinity of the corner of the resist pattern 60' is faster than that in the vicinity of the center of the resist pattern 60'. As a result, slimmed resist patterns 60a' and 60b' at each repeated slimming form a shape in which the corner that has rapidly receded is rounded and the center protrudes.

As illustrated in FIG. 20B, when a stair portion of a stacked body inside a memory portion is formed using the resist patterns 60a' and 60b' as a mask, there is a risk that a step is curved more in an upper layer so that positions of contacts CC' to be arranged in the respective steps may deviate from the steps (see arrows in the drawing).

According to the semiconductor storage device 1 of the embodiment, the resist patterns 71 to 73 are arranged at positions opposing the corners of resist patterns 61 to 63, respectively, when slimming of the resist patterns 61 to 63 is performed to form the stair portion STR.

As a result, it is possible to prevent that an etchant in the $O_2$ plasma from being excessive at the corners of the resist patterns 61 to 63. In other words, the excess etchant can be consumed by the resist patterns 71 to 73. Accordingly, it is possible to prevent the slimming rate from being increased at the corners compared to the centers of the resist patterns 61 to 63 and to prevent the corners of the resist patterns 61 to 63 from receding rapidly.

According to the semiconductor storage device 1 of the embodiment, the stair portion STR is formed using the resist patterns 61a to 61d, 62a to 62d, and 63a to 63d having substantially equal amounts of recession caused by slimming between the center and the corner. As a result, it is possible to prevent the respective steps of the stair portion STR from being curved and to arrange the contacts CC more reliably in the respective steps. In addition, it is possible to arrange the contacts CC in the respective steps, for example, without widening a width of the terrace portion of each step of the stair portion STR so that it is possible to reduce a size of the semiconductor storage device 1.

According to the semiconductor storage device 1 of the embodiment, it is possible to adjust the amount of slimming per execution between the center and the corner of the resist patterns 61a to 61d, 62a to 62d, and 63a to 63d so as to be substantially equal, and thus, it is possible to increase the number of times of slimming in one resist pattern and to reduce manufacturing cost.

Incidentally, the amount of slimming per execution between the center and the corner of the resist patterns 61a to 61d, 62a to 62d, 63a to 63d can be made more uniform by appropriately adjusting lengths in the Y direction and lengths in the X direction of the resist patterns 71 to 73, and distances of the resist patterns 71 to 73 with respect to the resist patterns 61 to 63. As a result, the end portion facing the scribe line 30 and extending in the Y direction can be formed more linearly in the resist patterns 61a to 61d, 62a to 62d, and 63a to 63d.

(First Modification)

Next, a semiconductor storage device of a first modification of the embodiment will be described with reference to FIGS. 21 and 22. The semiconductor storage device of the first modification is different from that of the embodiment in terms of a region where a dummy stacked body is arranged.

Figure 21:
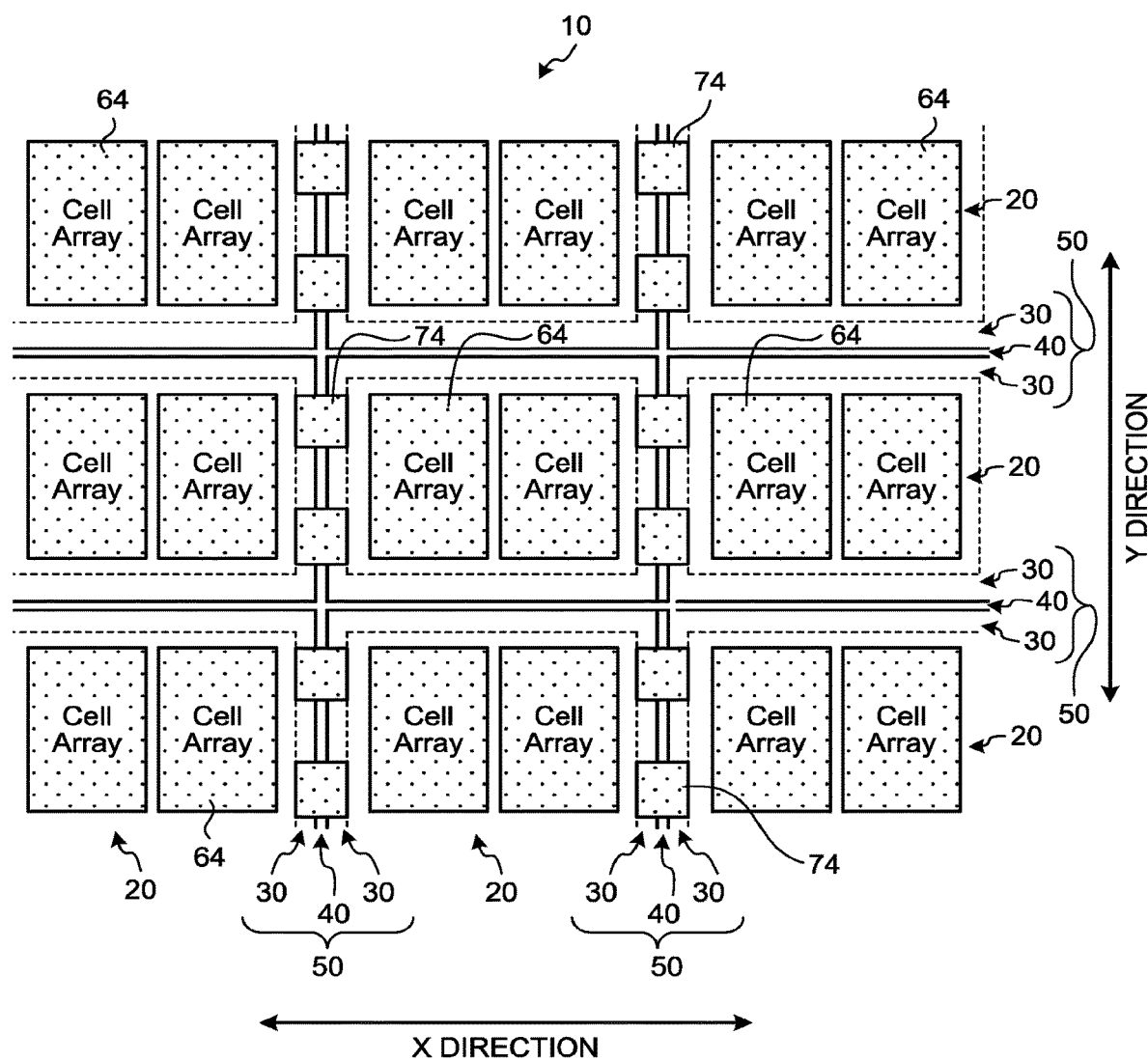
FIG. 21 is a plan view illustrating an arrangement example of a resist pattern in one step of a method for manufacturing a semiconductor storage device according to a first modification of the embodiment.

FIG. 21 is a plan view illustrating an arrangement example of resist patterns 64 and 74 in one step of a method for manufacturing the semiconductor storage device according to the first modification of the embodiment. As illustrated in FIG. 21, the resist pattern 64 as a first mask pattern and the resist pattern 74 as a second mask pattern are formed to cover a part of the stack body on the wafer 10 when forming a stair portion in a manufacturing process of the semiconductor storage device of the first modification.

The resist pattern 64 is formed to cover a portion to serve as a plane of the cell array region 20, for example, similarly to the example of the above-described embodiment.

The resist pattern 74 extends in the Y direction from a position which opposes a corner of the resist pattern 64 facing the outer side of the cell array region 20 toward a position which opposes a center of the resist pattern 64 between two planes aligned side by side in the X direction, and extends in a direction opposite to the center of the resist pattern 64. That is, the resist pattern 74 protrudes from the corner of the resist pattern 64 toward the scribe line 30 in the Y direction. The amount of protrusion at this time is, for example, 10 μm or more, and more preferably 100 μm or more. Even in the configuration of the first modification, it is preferable that two pairs of the resist patterns 74 be arranged to be line-symmetric with each other with respect to a center line passing through the center of the single resist pattern 64 in the Y direction.

Figure 22:
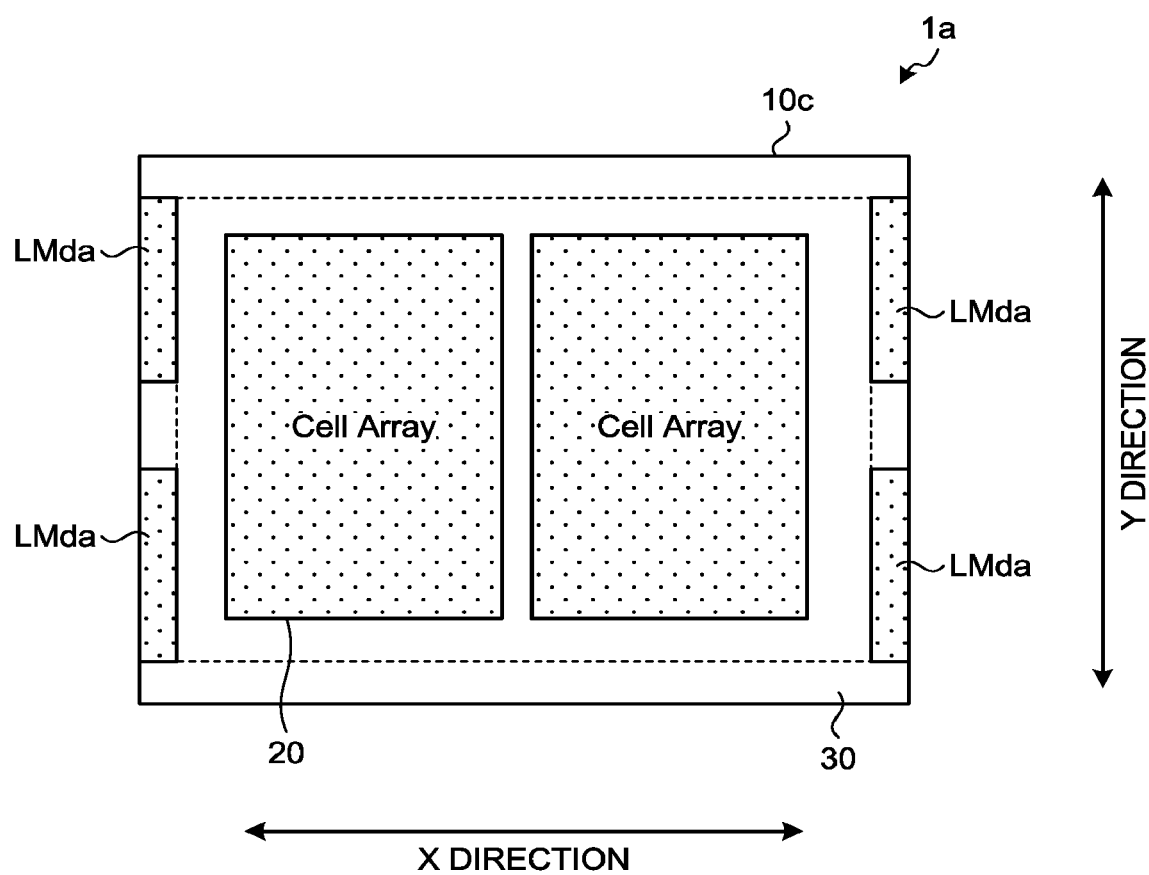
FIG. 22 is a view schematically illustrating an example of a configuration of the semiconductor storage device according to the first modification of the embodiment.

FIG. 22 is a view schematically illustrating an example of a configuration of a semiconductor storage device 1a according to the first modification of the embodiment. As illustrated in FIG. 22, at least a bottom surface of a dummy stacked body LMda protrudes toward the scribe line 30 in the Y direction from the position which opposes the corner of the stacked body LM facing the outer side of the cell array region 20, in the semiconductor storage device 1a of the first modification manufactured based on the resist patterns 64 and 74 arranged as described above. The amount of protrusion at this time is, for example, 10 μm or more, and more preferably 100 μm or more.

According to the semiconductor storage device 1a of the first modification, the resist pattern 74 protrudes from the corner of the resist pattern 64 by a predetermined amount so that it is possible to more precisely perform adjustment such that coverages of the resist patterns 64 and 74 become equal between the center and the corner of the resist pattern 64.

According to the semiconductor storage device 1a of the first modification, the resist pattern 74 protrudes from the corner of the resist pattern 64 by a predetermined amount so that it is also possible to suppress the amount of slimming on the side facing the scribe line 30 in the Y direction at the corner of the resist pattern 64. Accordingly, a stair portion having more linear steps is obtained in a memory portion.

(Second Modification)

Next, a semiconductor storage device of a second modification of the embodiment will be described with reference to FIGS. 23, 24A, and 24B. The semiconductor storage device of the second modification is different from that of the embodiment in terms of the number of planes provided in the semiconductor storage device.

Figure 23:
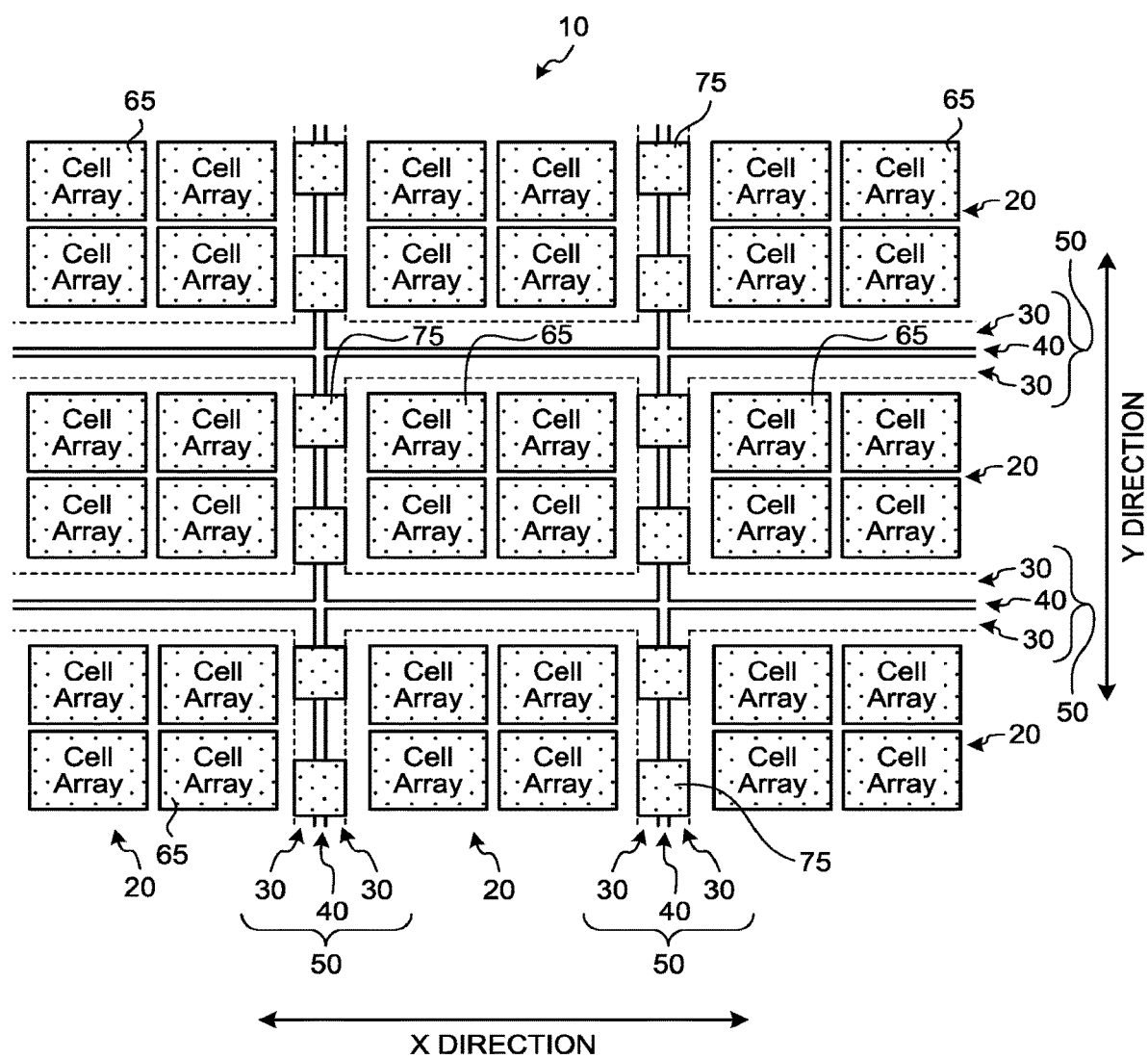
FIG. 23 is a plan view illustrating an arrangement example of a resist pattern in one step of a method for manufacturing a semiconductor storage device according to a second modification of the embodiment.

FIG. 23 is a plan view illustrating an arrangement example of resist patterns 65 and 75 in one step of a method for manufacturing the semiconductor storage device according to the second modification of the embodiment. As illustrated in FIG. 23, the semiconductor storage device of the second modification has four planes in one cell array region 20.

When forming a stair portion in a manufacturing process of the semiconductor storage device of the second modification, the resist pattern 65 as a first mask pattern and the resist pattern 75 as a second mask pattern are formed on a stacked body before being subjected to replacement with a word line formed on the wafer 10.

The resist pattern 65 is formed to cover a portion to serve as a plane of the cell array region 20.

The resist pattern 75 extends in the Y direction from a position which opposes a corner of the resist pattern 65 on one side in the Y direction toward a position which opposes the resist pattern 65 on another side in the Y direction, among the four planes aligned side by side in the X direction.

Here, the corner of the resist pattern 65 refers to a corner surrounded by the scribe line 30 in at least two directions, for example, among four corners of the resist pattern 65 that covers one plane. That is, the above-described corner of the resist pattern 65 is a corner at a position coinciding with a corner of the cell array region 20 among the respective corners of the resist pattern 65 arranged inside the cell array region 20. The resist pattern 75 extends in the Y direction from a position which opposes the corner of the cell array region 20 to a position which opposes the center of the cell array region 20. Further, the resist pattern 75 is not formed at the center of the cell array region 20, that is, at a position which opposes a space between the two resist patterns 65 aligned side by side in the Y direction inside the cell array region 20.

When the four planes are arranged inside the single cell array region 20 and the scribe line 30 is not arranged between the plurality of planes aligned side by side in the Y direction in this manner, it is sufficient to consider a plurality of the resist patterns 65 formed respectively on the plurality of planes aligned side by side in the Y direction as one resist pattern group and to arrange the resist pattern 75 in the vicinity of a corner of a resist pattern group. This is because a spacing among the four planes arranged inside the single cell array region 20 is sufficiently small, and a difference in slimming rate and a difference in recession amount of the resist pattern 65 due to a difference in coverage hardly occur.

Incidentally, the second resist pattern with respect to the first resist pattern may be caused to protrude from a corner of the first resist pattern toward the scribe line in the Y direction even in the configuration of the second modification.

Figure 24A:
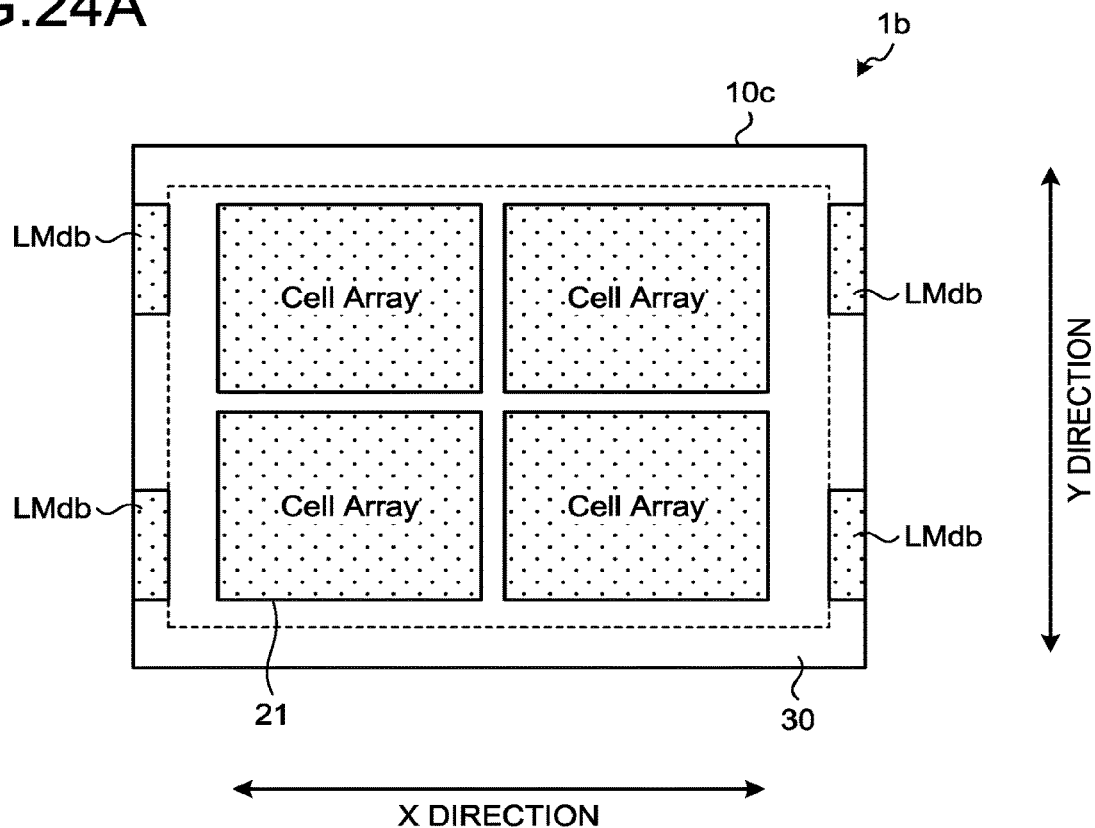
FIGS. 24A and 24B are views schematically illustrating examples of configurations of the semiconductor storage device according to the second modification of the embodiment.
Figure 24B:
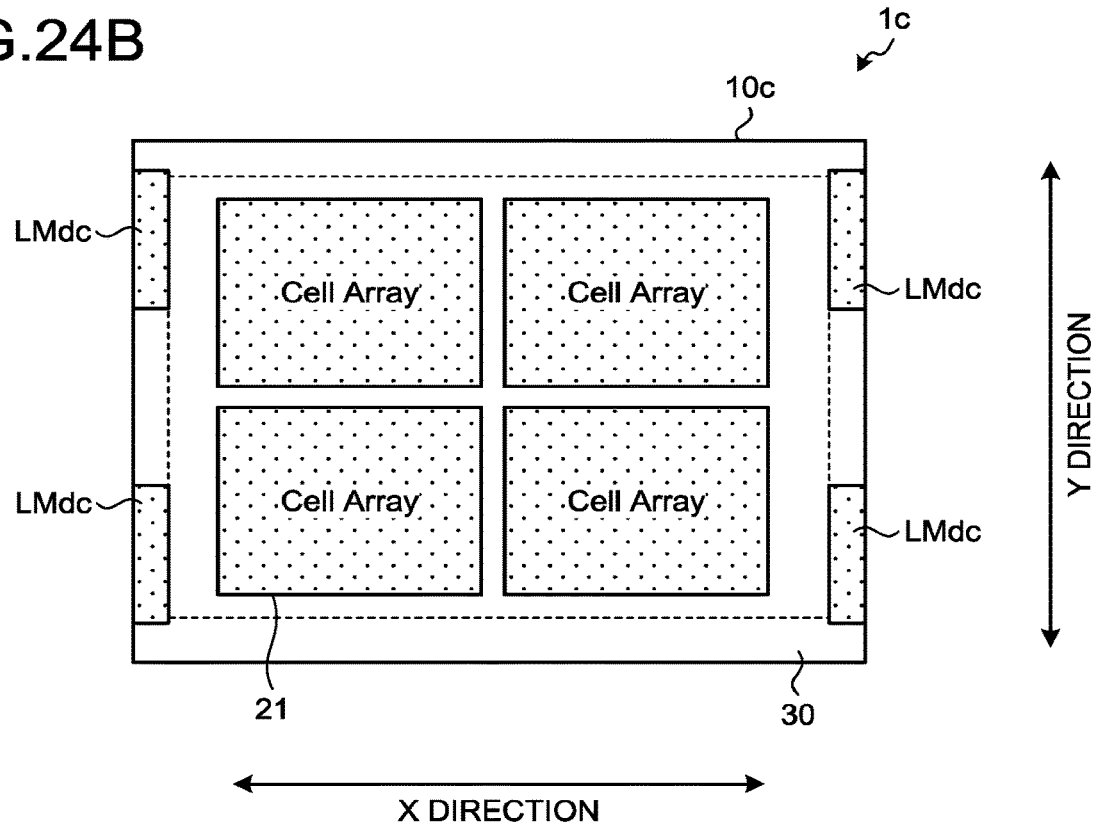

FIGS. 24A and 24B are views schematically illustrating examples of configurations of semiconductor storage devices 1b and 1c according to the second modification of the embodiment.

As illustrated in FIG. 24A, a dummy stacked body LMdb is arranged at a position, which opposes a corner surrounded by the scribe line 30 in two directions among corners of two planes aligned side by side in the Y direction inside the cell array region 21, in the scribe line 30 in the X direction in the semiconductor storage device 1b of the second modification manufactured based on the resist patterns 65 and 75 arranged as described above.

When the second resist pattern is caused to protrude to the scribe line in the Y direction as illustrated in FIG. 24B, at least a bottom surface of a dummy stacked body LMdc protrudes from a corner of a plane toward the scribe line 30 in the Y direction in the semiconductor storage device 1c of the second modification. The amount of protrusion at this time is, for example, 10 µm or more, and more preferably 100 µm or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a cell array region having a plurality of memory cells;
   an outer edge portion arranged at an end portion to surround the cell array region; and
   a stacked body in which a plurality of conductive layers are stacked via a first insulating layer and which has a stair portion in which end portions of the plurality of conductive layers form a stair shape is provided inside the cell array region, the stair portion facing the outer edge portion, and
   wherein a center of at least one step of the stair portion has a recess directed toward an inner side of the cell array region.

2. The semiconductor storage device according to claim 1, wherein
   the stair portion has a region including a plurality of steps which are stepped up toward the inner side of the cell array region, and
   a recess of each of the steps becomes smaller as a step is located on an upper side inside the region.

3. The semiconductor storage device according to claim 2, wherein
   the stair portion has a plurality of the regions in which the recess of each of the steps becomes smaller as a step is located on an upper side, and
   the recess of each of the steps becomes smaller as a region is located on an upper side.

4. The semiconductor storage device according to claim 1, further comprising a plurality of contacts aligned side by side along a direction in which terrace portions of the respective steps extend are each arranged on each of the steps of the stair portion.

5. The semiconductor storage device according to claim 4, wherein
the stacked body has a plurality of strip portions that extend in an elevating direction of the stair portion and divide the stacked body, and
the one of the plurality of the contacts is arranged in each divided region of the stacked body.

6. The semiconductor storage device according to claim 1, further comprising
a dummy stacked body in which a plurality of second insulating layers are stacked via a third insulating layer having an identical composition as the first insulating layer, in an end portion of the outer edge portion on a side facing the stair portion, the end portion being a position opposing a region where at least two directions of the cell array region are surrounded by the outer edge portion.

7. The semiconductor storage device according to claim 6, wherein
the dummy stacked body has a dummy stair portion which opposes the stair portion of the stacked body and is stepped up in a direction away from the stacked body.

8. The semiconductor storage device according to claim 6, wherein
the stair portion has a region including a plurality of steps, and
a recess of each of the steps becomes smaller as a step is farther from the dummy stacked body inside the region.

9. The semiconductor storage device according to claim 8, wherein
the stair portion has a plurality of the regions in which the recess of each of the steps becomes smaller as a step is farther from the dummy stacked body, and
the recess of each of the steps becomes smaller as a region is farther from the dummy stacked body.

10. The semiconductor storage device according to claim 1, further comprising
a plurality of pillars which extend in a stacking direction of the stacked body inside the stacked body and form the plurality of memory cells at respective intersections with the plurality of conductive layers.

* * * * *